(12) United States Patent
de Ruijter

(10) Patent No.: US 11,962,325 B2
(45) Date of Patent: Apr. 16, 2024

(54) RECEIVER WITH DUTY CYCLED LISTENING

(71) Applicant: Silicon Laboratories Inc., Austin, TX (US)

(72) Inventor: Hendricus de Ruijter, Roseville, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/873,844

(22) Filed: Jul. 26, 2022

(65) Prior Publication Data

US 2024/0039557 A1 Feb. 1, 2024

(51) Int. Cl.
*H03M 13/00* (2006.01)
*H03M 13/11* (2006.01)

(52) U.S. Cl.
CPC ................................ *H03M 13/116* (2013.01)

(58) Field of Classification Search
CPC .................................................. H03M 13/116
See application file for complete search history.

(56) References Cited

U.S. PATENT DOCUMENTS

| | | | |
|---|---|---|---|
| 7,782,805 B1 * | 8/2010 | Belhadj | H04L 47/00 370/476 |
| 9,608,905 B1 * | 3/2017 | Zhang | H04L 27/26526 |
| 10,172,105 B2 | 1/2019 | de Ruijter et al. | |
| 10,911,129 B1 | 2/2021 | De Ruijter et al. | |
| 2003/0161348 A1 * | 8/2003 | Mills | H04L 12/12 370/422 |
| 2010/0271991 A1 * | 10/2010 | Kimura | H04L 1/08 370/310 |
| 2011/0261814 A1 * | 10/2011 | Matthews | H04L 47/28 370/389 |

* cited by examiner

*Primary Examiner* — Samir W Rizk

(74) *Attorney, Agent, or Firm* — NIELDS, LEMACK & FRAME, LLC

(57) ABSTRACT

A system and method for detecting the preamble of a wireless packet is disclosed. The system utilizes one or more received fragments as inputs to a correlator, forming correlator content inside the correlator memory. After every sample from the received fragment is provided to the correlator, the correlator then compares the correlator content to a known pattern pre-programmed as a set of correlation coefficients. The correlation coefficients may not align with the correlator content because the symbol boundaries are not known a-priori. By cyclic rotation of the correlation coefficients relative to the correlator content, or cyclic rotation of the correlator content relative to the known correlation coefficients, a match with one or more preamble symbols may be found. This technique may be used to reduce power during the preamble detection process. Alternatively, this technique can also be used for antenna diversity, multi PHY and multichannel applications.

20 Claims, 22 Drawing Sheets

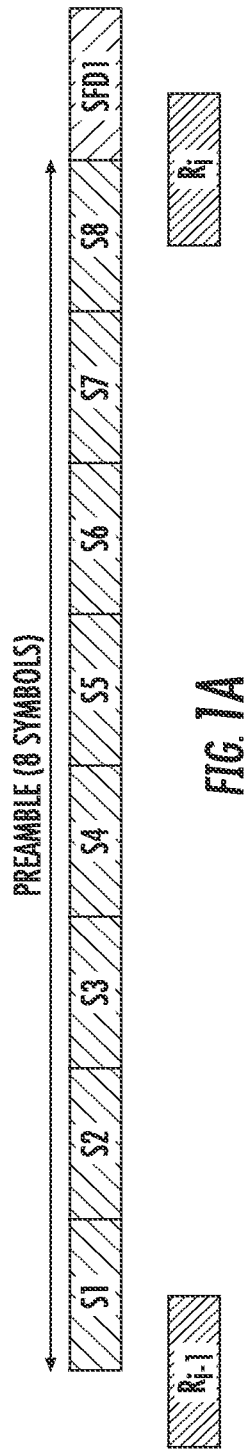
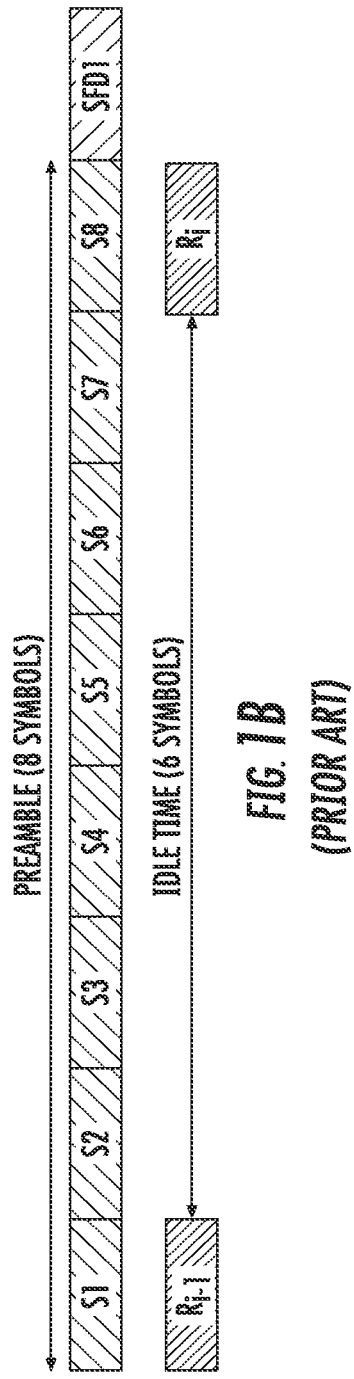
FIG. 1A
(PRIOR ART)
FIG. 1B
(PRIOR ART)

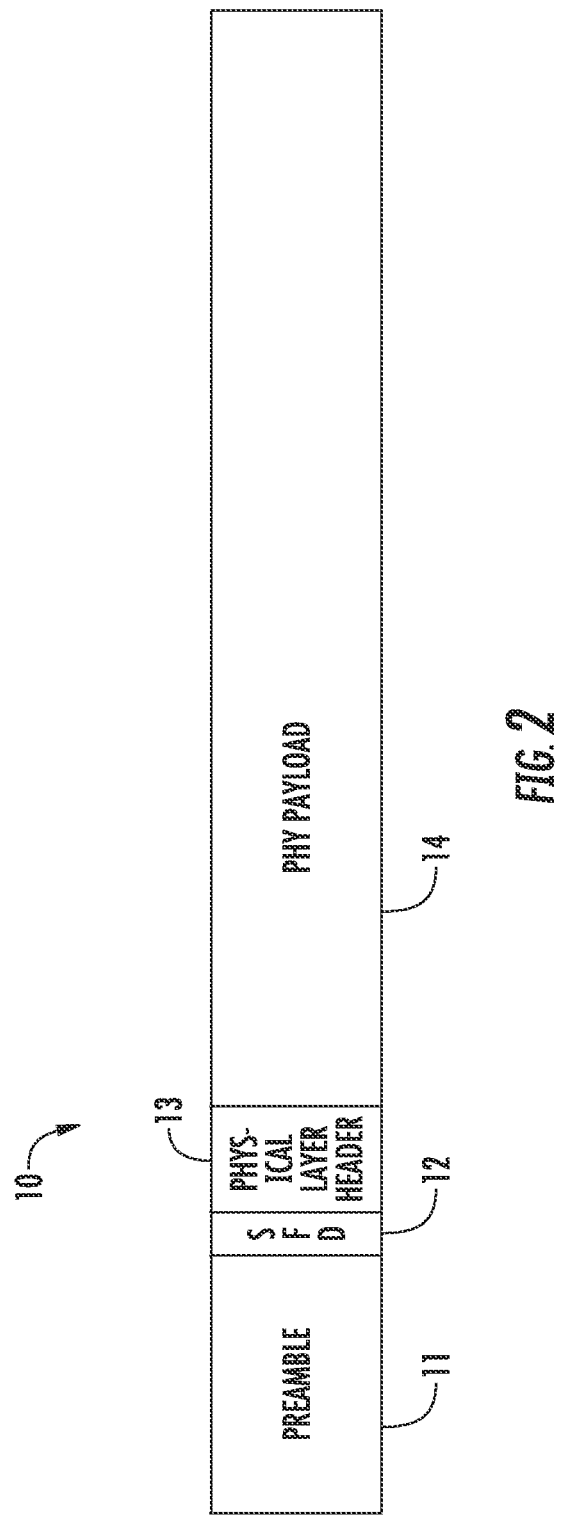

RECEIVER WITH DUTY CYCLED LISTENING

This disclosure describes systems and methods allowing a receiver to detect a preamble using fractional symbol recombination.

BACKGROUND

In many wireless network protocols, a packet begins with a preamble, which must be detected by the receiving node. For example, the preamble may comprise a number of repeating patterns. Examples of repeating patterns are repeating symbols as used in Direct Sequence Spread Spectrum packets, repeating patterns in a Short Training Field (STF) as used in Orthogonal Frequency Division Multiplexing (OFDM) packets, Zadoff-Chu sequences as used in 3GPP LTE (Long Term Evolution) and an alternating pattern of ones and zeros as frequently used in FSK packets.

In operation, a preamble detector compares the incoming wireless data to a known pattern. This process may be referred to as correlation. If the incoming wireless data matches the known pattern to a predetermined accuracy, a preamble is detected.

This operation works well when the preamble detector is always listening for the preamble. However, there are situations where this is not possible or optimal. For example, the wireless device may include a plurality of different antennas, where the wireless signal from each of these antennas must be compared to the known pattern. If there is only one receiver, this implies that the receiver is not able to listen to the entire preamble for any of the antennas. In another embodiment, to save power, the receiver may wish to limit the amount of time that the preamble detector is active. In yet another embodiment, the wireless device may need to scan a plurality of channels, where the wireless signal from each of these channels must be compared to the known pattern. If there is only one receiver, this implies that the receiver is not able to listen to the entire preamble for any of the channels. In another embodiment, the wireless device may need to scan a plurality of PHY modes, where the wireless signal from each of the PHY modes must be compared to a known pattern, associated to each of the PHY modes. If there is only one receiver, this implies that the receiver is not able to listen to the entire preamble for any of the PHY modes.

Therefore, some preamble detectors are configured to detect the preamble after only a subset of the preamble symbols have been received. For example, in some network protocols, the preamble may be 8 symbols in length. The preamble detector may be able to detect the preamble after receiving less than 8 symbols, such as 2 symbols or even 1 symbol. Thus, the preamble detector may be enabled so as to receive a fragment of the preamble, where that received fragment may be at least one symbol. In other embodiments, the received fragment may be less than a symbol.

However, for these preamble detectors to operate correctly, the entirety of the received fragment or received fragments that are received by the receiver must be part of the preamble field. This imposes limitations on the duty cycle used by the preamble detector. For example, in FIG. 1A, the duty cycle is ⅛, such that the detector is active for a fragment, which may be 1 symbol, and idle for a duration of 7 symbols. In this embodiment, the preamble field is 8 symbols in length, followed by a start-of-frame delimiter (SFD). Ideally, since the preamble is 8 symbols long, a duty cycle of ⅛ should be sufficient to capture one symbol of the preamble. However, as shown in FIG. 1A, if the preamble detector is enabled just prior to the beginning of the preamble, the preamble detector will not receive any fragments that are entirely within the preamble field. These received fragments which are not entirely within the preamble field, may be discarded. Thus, to ensure that at least one received fragment (which may be at least one symbol) is entirely within the preamble field, the duty cycle must be increased to at least ⅐, as shown in FIG. 1B. Note that whenever the $R_{i-1}$ received fragment begins, at least one of the $R_{i-1}$ and the $R_i$ received fragments must be entirely within the preamble field.

However, this increase in duty cycle results in a corresponding increase in power consumption. Further, in embodiments that include multiple antennas or multiple channels or multiple PHY modes (e.g., Bluetooth and O-QPSK PHY according to 802.15.4-2020), this increase in duty cycle limits how many antennas, channels or PHY modes may be sampled during each preamble field, or limits the length of the received fragment per antenna or per channel.

Therefore, it would be beneficial if there was a system and method that enabled preamble detection to occur even if one of the fragments that was received started before or ended after the preamble field. It would also be advantageous if this system and method works for a plurality of modulation schemes.

SUMMARY

A system and method for detecting the preamble of a wireless packet is disclosed. The system utilizes one or more received fragments as inputs to a correlator, forming correlator content inside the correlator memory. After every sample from the received fragment is provided to the correlator, the correlator then compares the correlator content to a known pattern pre-programmed as a set of correlation coefficients. The correlation coefficients may not align with the correlator content because the symbol boundaries are not known a-priori. By cyclic shifting of the correlation coefficients relative to the correlator content, or cyclic shifting of the correlator content relative to the known correlation coefficients, a match with one or more preamble symbols may be found. The cyclic shift may require processing time that may not be performed while receiving a received fragment. After the receiving a received fragment, the cyclic shifting may be executed so that the cyclic shifting can be processed after the received fragment is received, or as part of the idle time, before receiving the next received fragment. This technique may be used to reduce power during the preamble detection process. Alternatively, this technique can also be used for antenna diversity, multi-PHY and multi-channel applications.

According to one embodiment, an apparatus for receiving a packet on a wireless network is disclosed. The packet includes a preamble field where a preamble is located, and the preamble is made up of a plurality of identical patterns. The apparatus comprises an antenna to receive a signal containing the packet; an RF circuit to process the signal and create one or more received fragments; and a preamble detector to detect a preamble based on at least one pattern in at least one received fragment of the one or more received fragments, wherein each received fragment is at least one pattern in duration, and is spaced from a subsequent received fragment by an idle time. In some embodiments, the at least one received fragment is stored in the preamble detector as correlator content and the preamble detector detects the at least one pattern either while the received fragment is being received, or during the idle time by cyclically shifting correlation coefficients relative to the correlator content. In certain embodiments, the preamble detector comprises a correlator and the correlator operates at a first rate while receiving a received fragment and at a second rate when cyclically shifting the correlation coefficients relative to the correlator content and wherein the second rate is higher than the first rate. In certain embodiments, the preamble detector comprises a cost function engine. In some embodiments, a duration of an integral number of idle times added to a duration of a same integral number of received fragments, is equal to a duration of the preamble field. In some embodiments, a duration of the idle time is equal to a duration of an integral number of patterns. In some embodiments, the preamble detector is configured to detect the at least one pattern, wherein the at least one pattern spans across multiple received fragments. In some embodiments, the preamble detector is configured to detect the at least one pattern, wherein the at least one pattern is misaligned within at least one received fragment. In certain embodiments, the preamble detector comprises a data shift register to hold the at least one received fragment and a coefficient register to hold correlation coefficients, wherein the preamble detector cyclically shifts the correlation coefficients relative to the at least one received fragment to detect the at least one pattern. In certain embodiments, the coefficient register is a cyclic shift register, and the preamble detector cyclically shifts the correlation coefficients within the coefficient shift register to detect the at least one pattern. In certain embodiments, the data shift register is a cyclic shift register and the preamble detector cyclically shifts the at least one received fragment within the data shift register to detect the at least one pattern. In certain embodiments, the preamble detector comprises a second data shift register to hold the received fragment and the cyclically shifting of the correlation coefficients relative to the at least one received fragment is performed by shifting samples from the second data shift register into the data shift register.

According to another embodiment, an apparatus for receiving a packet on one of a plurality of channels on a wireless network is disclosed. The packet includes a preamble field where a preamble is located, and the preamble is made up of a plurality of identical patterns. The apparatus comprises an antenna to receive a signal containing the packet; an RF circuit to process the signal and create one or more received fragments from each of the plurality of channels; and a preamble detector comprising a plurality of correlators to detect a preamble based on at least one pattern in at least one received fragment on any of the plurality of channels, wherein the one or more received fragments received from each individual channel is at least one pattern in duration, and is spaced from a subsequent received fragment on that channel by an idle time, wherein the at least one received fragment is stored in the preamble detector as correlator content and each of the plurality of correlators is configured to operate on one of the plurality of channels to detect the at least one pattern either while a received fragment is being received, or during the idle time by cyclically shifting correlation coefficients relative to the correlator content. In some embodiments, the plurality of correlators are operating at a first rate while receiving a received fragment and at a second rate when cyclically shifting the correlation coefficients relative to the correlator content and wherein the second rate is higher than the first rate. In some embodiments, parameters of the RF circuit are modified during the idle time.

According to another embodiment, an apparatus for receiving a packet on a wireless network is disclosed. The packet includes a preamble field where a preamble is located, and the preamble is made up of a plurality of identical patterns. The apparatus comprises a first antenna to receive a first signal containing the packet; a second antenna to receive a second signal containing the packet; an antenna switch to select the first signal or the second signal from the first antenna and the second antenna by toggling the antenna switch during an idle time; an RF circuit to process the first signal and the second signal and create a first set of one or more received fragments when processing the first signal and create a second set of one or more received fragments when processing the second signal; and a preamble detector to detect a preamble based on at least one pattern in either the first set or the second set, wherein each received fragment from the first set is at least one pattern in duration, and the received fragment is spaced from a subsequent received fragment by the idle time equal to a duration of an integral number of identical patterns and each received fragment from the second set is at least one pattern in duration, and the received fragment is spaced from a subsequent received fragment by the idle time equal to the duration of an integral number of identical patterns. In some embodiments, the preamble detector comprises a first correlator and a second correlator, each comprising a data shift register for holding correlator content from the at least one received fragment and a coefficient register for holding correlation coefficients, and the first correlator detects the at least one pattern either while the received fragment is being received from the first antenna, or during the idle time by cyclically shifting its correlation coefficients relative to its correlator content, and the second correlator detects the at least one pattern either while the received fragment is being received from the second antenna, or during the idle time by cyclically shifting its correlation coefficients relative to its correlator content. In some embodiments, in at least one of the first set or the second set, a duration of an integral number of idle times added to a duration of a same integral number of received fragments, is equal to a duration of the preamble field. In some embodiments, after the preamble is detected, the apparatus selects one of the antennas to receive the packet, wherein selection of an antenna is based on a received signal strength index (RSSI) of at least one received fragment. In some embodiments, parameters of the RF circuit are modified between successive received fragments.

BRIEF DESCRIPTION OF THE DRAWINGS

For a better understanding of the present disclosure, reference is made to the accompanying drawings, in which like elements are referenced with like numerals, and in which:

FIGS. 1A-1B shows prior art preamble detection;

FIG. 2 shows the format of a representative message transmitted to the system of FIG. 1;

DETAILED DESCRIPTION

Figure 3A:
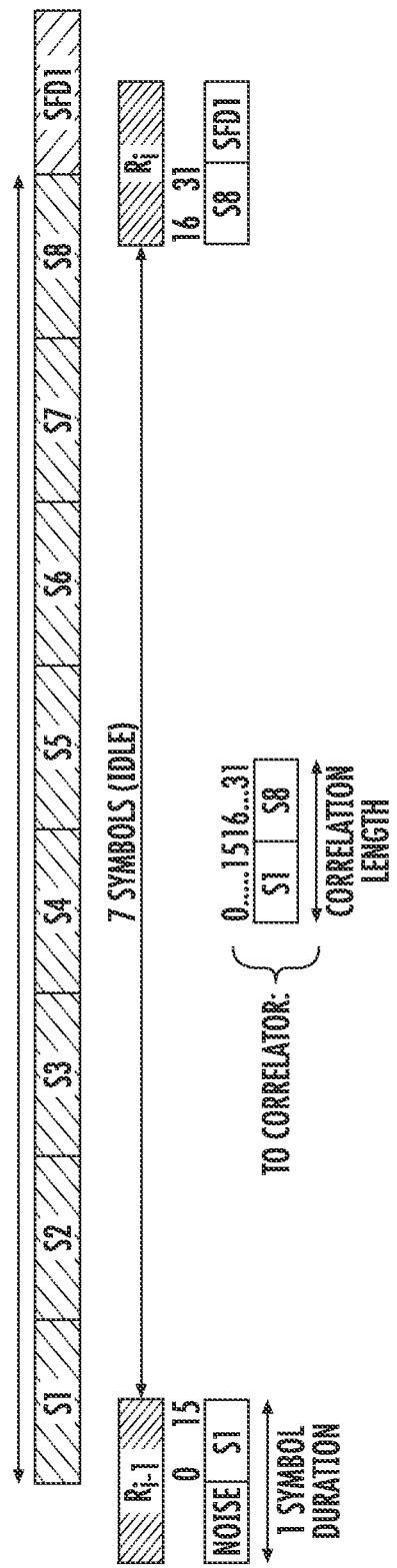
FIG. 3A shows a first scenario where preamble detection may be performed.

A preamble detector that is capable of using fragments that are not entirely within the preamble field is disclosed. Further, the preamble detector is also capable of detecting a preamble even if only one fragment is received and that received fragment is not aligned with the symbols in the preamble.

As described above, the preamble field may be made up of a plurality of symbols, which may all be identical. In certain embodiments, the preamble field may be 8 symbols in length. The preamble field is typically made up of a plurality of repeating patterns. In some embodiments, the pattern is contained within a single symbol, such that the number of repeating patterns is equal to the number of symbols. In other embodiments, the pattern may be made up of a plurality of symbols. For example, the repeating pattern may be 10, while the symbols are either 1 or 0.

Since the symbols in the preamble are identical, some preamble detectors indicate that the preamble is present after detection of a single symbol. To successfully perform this detection, there are a variation of scenarios that must be considered. In these scenarios, there are P symbols in the preamble field (the preamble length is P symbols) and the duty cycle is set to 1/P or more.

FIG. 2 shows the format of a representative packet that may be received by the system described herein. Packet 10 includes a preamble field 11. The preamble is used to denote the start of a packet and may have a predetermined bit sequence. The SFD (synchronization field delimiter) 12 is used to denote the end of the preamble 11 and represents the boundary between the preamble 11 and the physical layer header 13. The physical layer header 13 may be one or two bytes and may include length information representing the total length of the PHY Payload. Of course, the physical layer header 13 may be longer, if desired. Following the physical layer header 13 is the PHY payload 14, which, in some embodiments, may be up to 2048 bytes.

FIG. 2 represents the actual data that is in each field. However, prior to transmission, this data may be encoded into another format.

Certain encoding schemes, such as the O-QPSK PHY defined in IEEE802.15.4-2020 that utilizes spread spectrum DSSS (Direct-sequence spread-spectrum) and O-QPSK (offset-quadrature phase shift keying), convert the data into a different sequence of bits prior to transmission. For example, the O-QPSK PHY is based on spread spectrum DSSS, which uses a concept known as symbols, where each symbol represents 4 bits, and where each symbol is represented by 32 chips.

The O-QPSK PHY uses a chip rate of 2 Mcps. Four information bits are transmitted every 32 chips resulting in an actual bit rate of 250 kbps.

MSK (minimum shift keying) is a special case of offset QPSK (O-QPSK). In MSK, every chip in O-QPSK modulation can be considered a symbol containing an information bit. Thus, in MSK, the Information rate is the same as the on-air modulation rate.

FIG. 3A shows the first scenario receiving the 802.15.4-2020 O-QPSK PHY with 32 chips per symbol. In this scenario, the first received fragment, labelled $R_{i-1}$, begins before the preamble field, such that some of the samples in the first received fragment are before the preamble field, and a remainder of the samples in the first received fragment are in the preamble field. The receiver may be using oversampling, meaning that multiple samples may be used per chip. After providing a sample, the correlation result (correlation value) is evaluated by comparing with a detection threshold. The preamble is detected when the correlation result exceeds the detection threshold. For illustration purposes, instead of sample numbers, chip numbers are used within a symbol where the first chip in a symbol is numbered "0" and the last is numbered "31". The parts of the received fragment that are received before the preamble field are labelled noise, while the samples that are within the preamble field are labelled S1. In this scenario, the first 16 chips of the symbol S1 are part of the first received fragment. Because the duty cycle is set to 1/P, the second received fragment, labelled $R_i$, begins during the preamble field and ends in the SFD1 field. The first 16 chips of the second received fragment are the last part of the eighth symbol, S8, while the next 16 chips are part of the SFD1 field. While FIG. 3A shows the first 16 chips of S1 in the first received fragment and the last 16 chips of S8 in the second received fragment, it is understood that the chips may be different. For example, the first M chips of the first symbol, S1, may be part of the first received fragment, while the last 32-M chips of the eighth symbol, S8, may be in the second received fragment, where M is between 1 and 31.

For detection to be successful, the preamble detector must combine these two received fragments such that the first 16 chips of S1 are combined with the last 16 chips of S8 to form one combined, complete symbol. Thus, as shown in FIG. 3A, the correlator may sequentially receive the first and second fragments and combine them. An example of a correlator can be found in FIG. 8 of "A Hardware Efficient Preamble Detection Algorithm for Powerline Communication" by Stuckenberg et al. Instead of a correlator, a cost function engine (CFE), such as that described in U.S. Pat. No. 10,172,105, may be used to detect the preamble and establish the position of the symbol boundaries. The term "preamble detector", as used in this disclosure, refers to a correlator, CFE and the like.

Figure 3B:
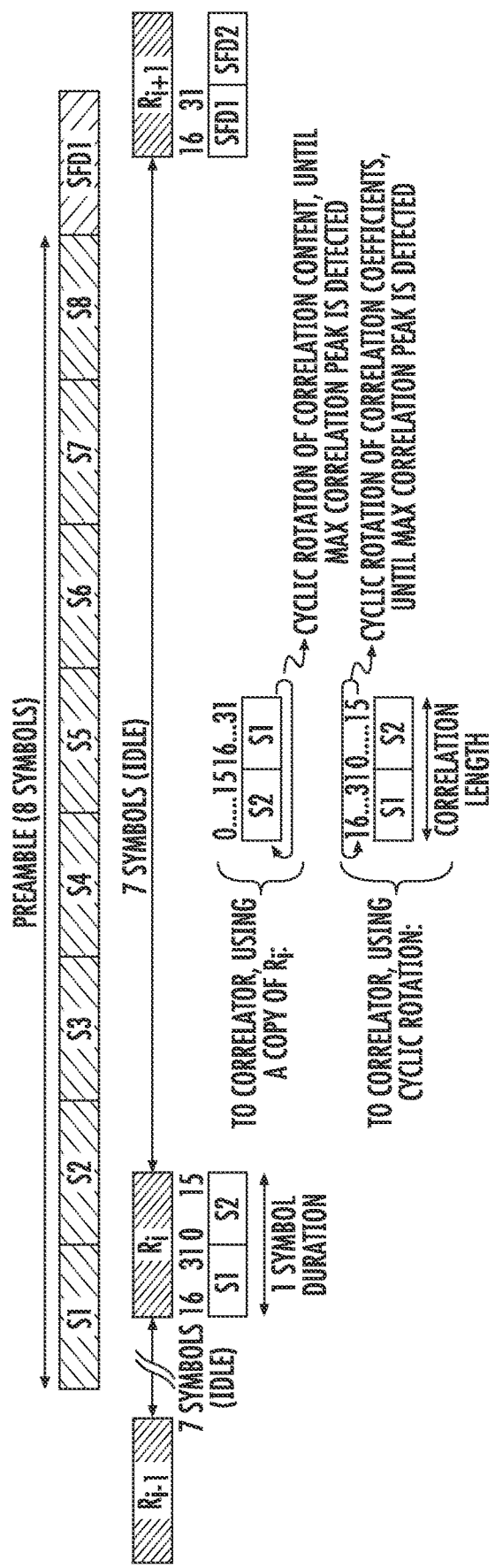
FIG. 3B shows a second scenario where preamble detection may be performed.

FIG. 3B shows a second scenario. Again, the duty cycle is 1/P. In this case, only one received fragment is within the preamble field. However, this received fragment is not aligned with the symbols in the preamble. In other words, the received fragment comprises the last 16 chips of the first symbol S1 and the first 16 chips of the second symbol S2. While FIG. 3B shows the last 16 chips of S1 and the first 16 chips of S2 in the received fragment, it is understood that the samples may be different. For example, the last M chips of the first symbol, S1, may be part of the received fragment, while the first 32-M chips of the second symbol, S2, may also be in the received fragment, where M is between 1 and 31. Further, while FIG. 3B shows the received fragment overlapping the first and second symbols, it is understood that the received fragment may overlap any two adjacent symbols.

Thus, in the scenario, the preamble detector may align the correlation coefficients with the correlator content, either by rotating the known pattern or the correlator content. A match is found when the correlation result exceeds the detection threshold.

Note that when the received fragment length is equal to 1 symbol, the preamble can be detected using only one symbol and if there are P symbols in the preamble field, the idle time may be as large as (P−1) symbols.

Figure 4:
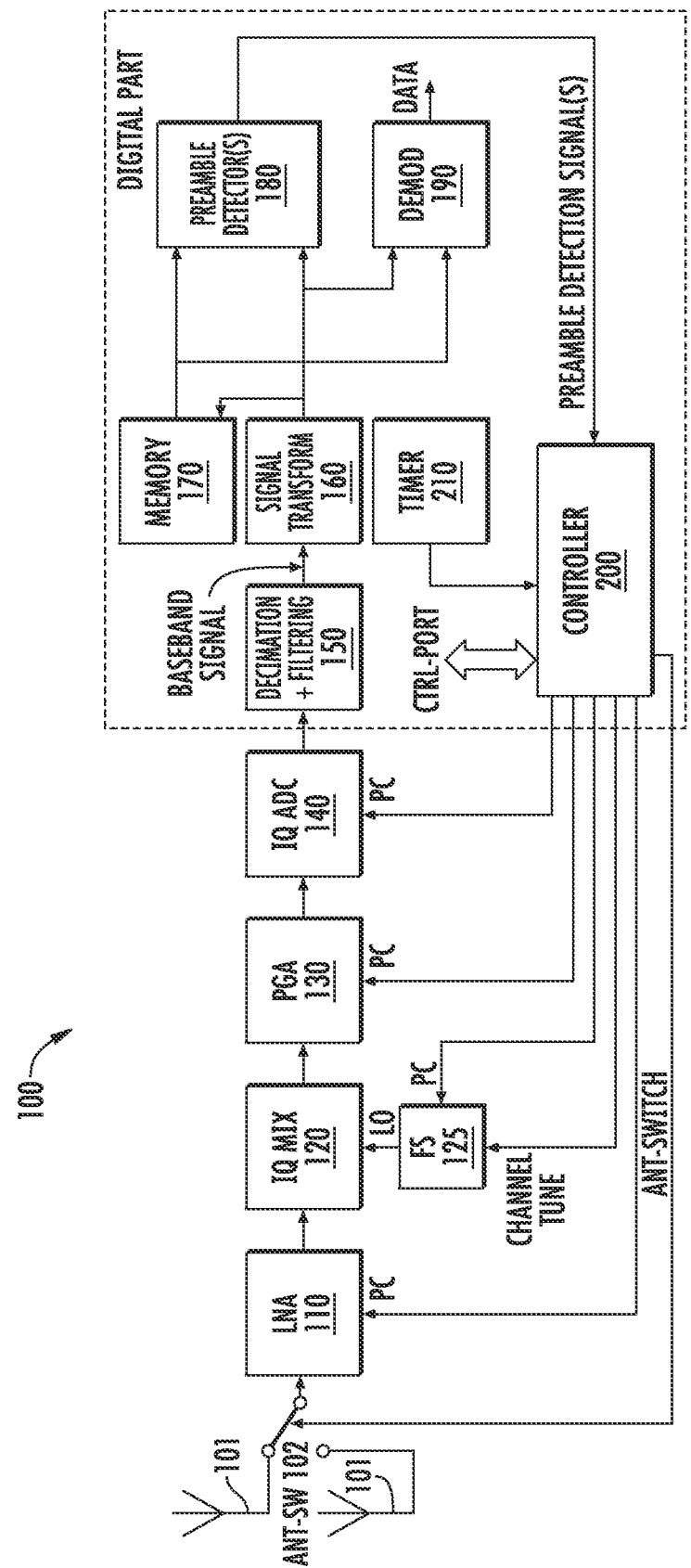
FIG. 4 is a block diagram of a receiver having the preamble detector described herein.

Having described these scenarios, a description of the read circuit for a wireless device that supports this preamble detection is provided in FIG. 4. The wireless device includes a processing unit, a memory and a receiver 100. The wireless signals first enter the receiver 100 through one of the one or more antennas 101. The antenna 101 is in electrical communication with a low noise amplifier (LNA) 110. The LNA 110 receives a very weak signal from the antenna 101 and amplifies that signal while maintaining the signal-to-noise ratio (SNR) of the incoming signal. In some embodiments, there may be multiple antennas 101. The wireless signals from these multiple antennas 101 enter a switch 102 that is used to select the signals from one of the antennas to the LNA 110.

The amplified signal is then passed to a mixer 120. The mixer 120 is also in communication with a frequency synthesizer 125, which provides a local oscillator (LO) frequency to the mixer 120. The cosine of the frequency may be referred to as $I_o$, while the sine of the frequency may be referred to as $Q_o$. The $I_o$ signal is then multiplied by the incoming signal to create the inphase signal, $I_m$. The $Q_o$ signal is then multiplied by a 90° delayed version of the incoming signal to create the quadrature signal, $Q_m$.

The inphase signal, $I_m$, and the quadrature signal, $Q_m$, from the mixer 120 are then fed into programmable gain amplifier (PGA) 130. The PGA 130 amplifies the $I_m$ and $Q_m$ signals by a programmable amount. These amplified signals are referred to as $I_g$ and $Q_g$.

The amplified signals, $I_g$ and $Q_g$, are then fed from the PGA 130 into an IQ analog to digital converter (ADC) 140. The IQ ADC 140 converts these analog signals to digital signals, $I_d$ and $Q_d$. These digital signals may then pass through a channel filter 150. The output of the channel filter 150 is referred to as the baseband signals. The components that are used to receive the signal from the antenna 101 and produce the baseband signals are referred to as the RF circuit.

The baseband signals are then input to a signal transformation block 160. The signal transformation block 160 may transform the IQ signal into signals that are suitable for the demodulator and preamble detector. The suitable signals may be in the form of I and Q signals, polar data (phase and amplitude), phase signals, amplitude signals or differentiated phase signal.

Further, in certain embodiments, the incoming data is oversampled, such that there are multiple samples for each bit. For example, multiple samples per chip are used in the case of O-QPSK DSSS (such as protocols like the O-QPSK PHY in IEEE 802.15.4-2020). Another example is FSK, where there are usually multiple samples per FSK symbol. In this embodiment, samples from one received fragment are stitched together with samples from the adjacent received fragment or copied received fragment to form a contiguous sequence of symbols. As an example, if the oversampling ratio is 4, and the last symbol of a received fragment is the third sample of the last received symbol, then the next received fragment should start with the fourth sample of another symbol.

The output from the signal transformation block 160 enters the preamble detector 180. As the output from the signal transformation block 160 enters to preamble detector 180, it enters a shift register. The data in the shift register may be referred to as the correlator content. In addition, the output from the signal transformation block 160 may also enter a memory device 170. The memory device 170 may be a one or more registers, a random access memory, or a dynamic random access memory. The contents of the memory device 170 may also be provided to the preamble detector 180. In other embodiments, the memory device 170 is located within the preamble detector 180. The preamble detector 180 may include a correlator or CFE that is used to compare the received incoming wireless signal to a known pattern, represented by correlation coefficients, to determine if the preamble pattern has been detected. The preamble detector 180 also includes a cyclic shifter, which is adapted to rotate (cyclic shift) either the correlation coefficients or the one or more received fragments.

As described in FIG. 3A-3B, at least one received fragment (which is the output from the signal transformation block 160) are provided to the preamble detector 180. Additionally, the output from the signal transformation block 160 is also provided to the demodulator 190 to create the data, which is then used to recover the rest of the incoming packet.

The implementation of the receiver 100 may be simplified if one or more of the above described functions are not required.

A controller 200 may be used to control some of these components. For example, a power control (PC) signal may be used to selectively power the LNA 110, the mixer 120, the frequency synthesizer 125, the PGA 130, and the IQ ADC 140. In addition, the controller 200 controls the switch 102 which selects one of the plurality of antennas 101. The controller 200 also controls the frequency that is output by the frequency synthesizer 125.

The Control Port (CTRL-port) from the controller 200 is used to control the digital part of the receiver 100. For example, a low power mode could be entered when the low power listening mode is used by clock gating and/or controlling digital power domains. The control port can also be used to control the sample timing of the samples entering the preamble detector 180. Other uses of the control port may include configuring the channel filter 150, the preamble detector 180 and the demodulator 190 to support multiple protocol/PHY listening modes.

The controller 200 also receives a preamble detection signal from the preamble detector 180. Based on this signal, the controller 200 may change the power control signal to the other components so as to allow the receiver 100 to receive the rest of the incoming packet.

A timer 210 is used to precisely time when samples are populated into preamble detector 180 as described in the various scenarios. The timer 210 can also be used to switch on receiver circuitry ahead of the required samples (during the idle time) associated with the received fragments, such that the receiver 100 has time to settle. For example, the received signal may need time to propagate to the receiver signal path. Alternatively, in multi-channel mode, the frequency synthesizer 125 may need time to settle a PLL to tune into another channel. The timer 210 may also be used to time-stamp the symbol boundaries using the Preamble detection signal(s). This time-stamp may, for example, be used to retrieve previously received information from the memory device 170 for demodulation by the demodulator 190. In multi-PHY mode embodiments, the controller 200 may need to reconfigure parameters during the idle time, such as the signal transformation block 160, the channel filter 150 or any other block in the wireless device, to adjust for proper preamble detection performance for each of the PHY modes. For example, the channel filter bandwidth could be changed when the plurality of PHY modes have different modulation bandwidths.

Figure 5A:
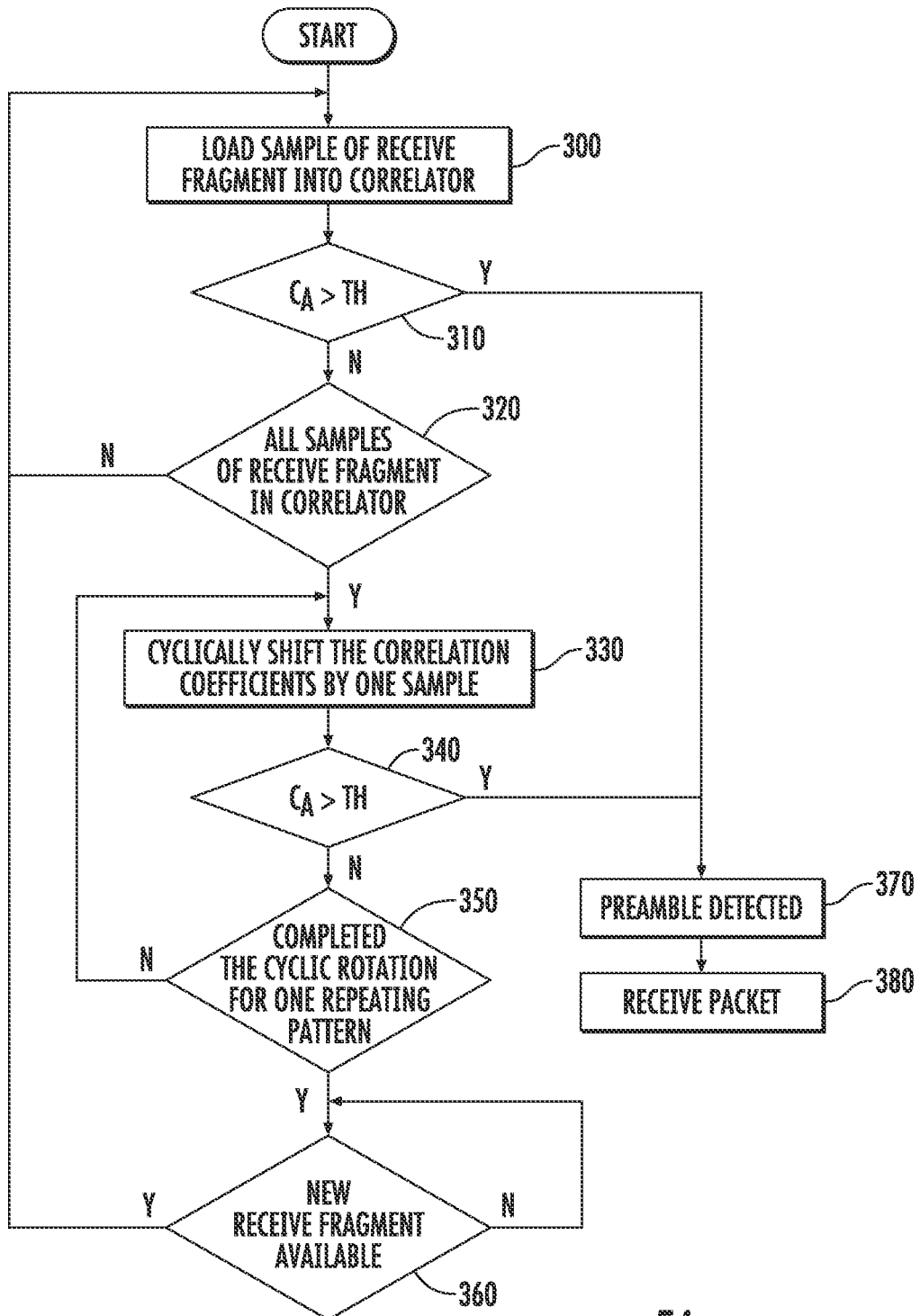
FIG. 5A-5C show the operation of the preamble detector according to different embodiments.
Figure 6A:
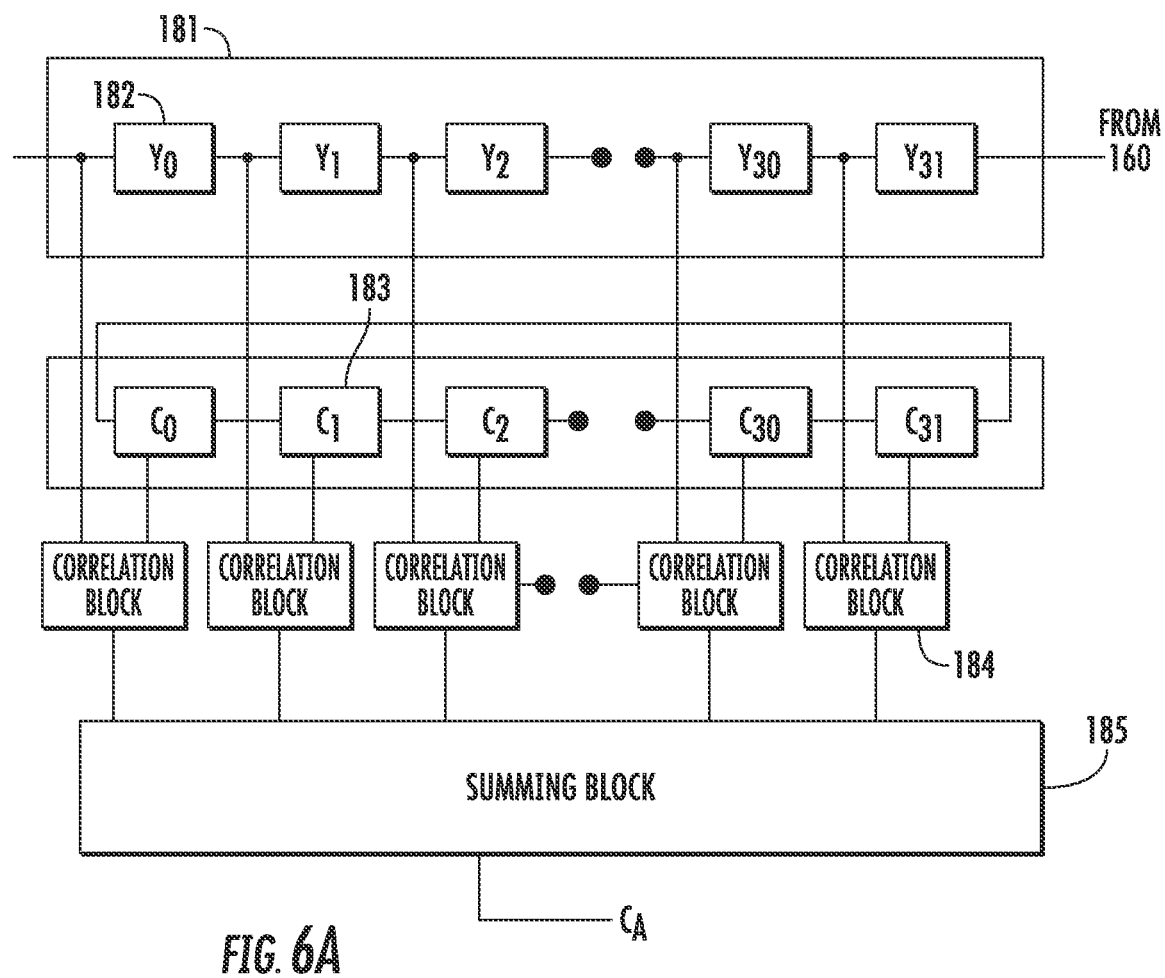
FIG. 6A-6C show block diagrams of the preamble detector according to different embodiments.

FIG. 5A shows a first embodiment of a flow chart that may be executed by the controller 200 to control the receiver 100. FIG. 6A shows a block diagram of the preamble detector 180 according to this embodiment. In this first embodiment, the preamble detector 180 includes a correlator. The correlator is made up of a data shift register 181 for storing the correlator content into a plurality of registers 182, each holding one data sample (Yi). The data shift register 181 is loaded from the outputs of the signal transformation block 160. The correlator also includes a coefficient register containing a set of correlation coefficients 183, the number of correlation coefficients 183 being equal to the length of the pattern that is being detected. In this embodiment, the correlation coefficients 183 are arranged as a cyclic shift register, wherein each correlation coefficient can be rotated. The correlator also includes a plurality of correlation blocks 184, where each correlation block 184 receives a correlation coefficient 183 and an output from a corresponding register 182 in the data shift register 181. The correlation block 184 may be a multiplier in the case of a correlator, or a subtractor followed by an absolute function in the case of a cost function engine (CFE). The outputs from the correlation blocks 184 all enter a summing block 185 which adds the outputs of the plurality of correlation blocks 184 to determine the correlation value ($C_A$). In the case of a correlation function, the output of the summing block is $C_A = \Sigma_{i=0}^{N} (C_i * Y_i)$ wherein larger values are indicative of a high correlation. In the context of a correlator, $Y_0$ to $Y_N$ may be referred to as the correlator content while $C_0$ to $C_N$ may be referred to as the correlation coefficients. In the case of a cost function engine, the output of the summing block is $C_A = \Sigma_{i=0}^{N} |Y_i - C_i|$, wherein smaller values are indicative of a high correlation. While this embodiment uses a cost function, the terms "correlator", "correlation coefficients" and "correlator content" are used when describing the cost function engine as well.

First, as shown in Box 300, a sample from the signal transformation block 160 is provided to the correlator in the preamble detector 180. The sample enters the data shift register 181. Specifically, the controller 200 enables the components in the receiver 100 to receive a fragment, where that received fragment is a plurality of samples. In the case where there is no oversampling, the term "sample" may be used interchangeably with the term "bit". In the case where oversampling is used, the term "sample" refers to a portion of a bit or chip. The length of the received fragment may be equal to the length of a symbol in the preamble field. In other embodiments, the length of the received fragment may be greater than the length of a symbol, such as 1.5 symbols or 2 symbols. When a new fragment arrives, the samples can be loaded into the data shift register 181 of the correlator as they are received, such as by using the receiver sample clock. As samples are received from the signal transformation block 160, the correlator continuously compares the input to the predetermined pattern developing a correlation value $C_A$ as shown in Box 310, in which high $C_A$ values are representative of high probability of receiving a preamble, and conversely, low $C_A$ values are representative of low probability of receiving a preamble. In the case where a CFE is used, lower values are indicative of a higher probability of receiving the preamble. In the case of a correlation function, when the correlation value $C_A$ exceeds a preset threshold (TH), the preamble is detected, as shown in Box 370. In certain embodiments, the preset threshold, TH, may be 70%. In the case of a cost function engine, the $C_A$ is compared against a lower threshold, where values below the threshold are indicative of a preamble. The rest of the packet is then received as shown in Box 380. The benefit of the loop formed by Boxes 300 to 320 is that it provides a possibility for detection while the received fragment is being received which results in minimal detection latency.

If the correlator does not indicate that the preamble has been detected, the preamble detector 180 checks if all of the samples from the fragment have been received, as shown in Box 320. For example, the preamble detector may utilize a counter to track the number of samples that have been received. If all samples from the fragment have not been received, the previous Boxes 300-320 are repeated. If, however, all of the samples from the fragment have been received, the preamble detector 180 performs a cyclic shift of the correlation coefficients in the coefficient shift register, as shown in Box 330. The correlator first compares correlation coefficients 0 through 31 of the known pattern (C[0:31]) with samples 0 through 31 of the received fragment (Y[0:31]), respectively. The correlator then cyclically shifts (or rotates) the known pattern such that correlation coefficients 1 through 31 and correlation coefficient 0 (C [1:31,0]) are compared to samples 0 through 31 of the received fragment (Y[0:31]), respectively. This rotation may continue until C[31,0:30] are being compared to Y[0:31], respectively. Further, the cyclic shifting continues until the number of cyclic shifts equals the length of the repeating pattern, which may be a symbol period, as shown in Box 350.

Figure 6B:
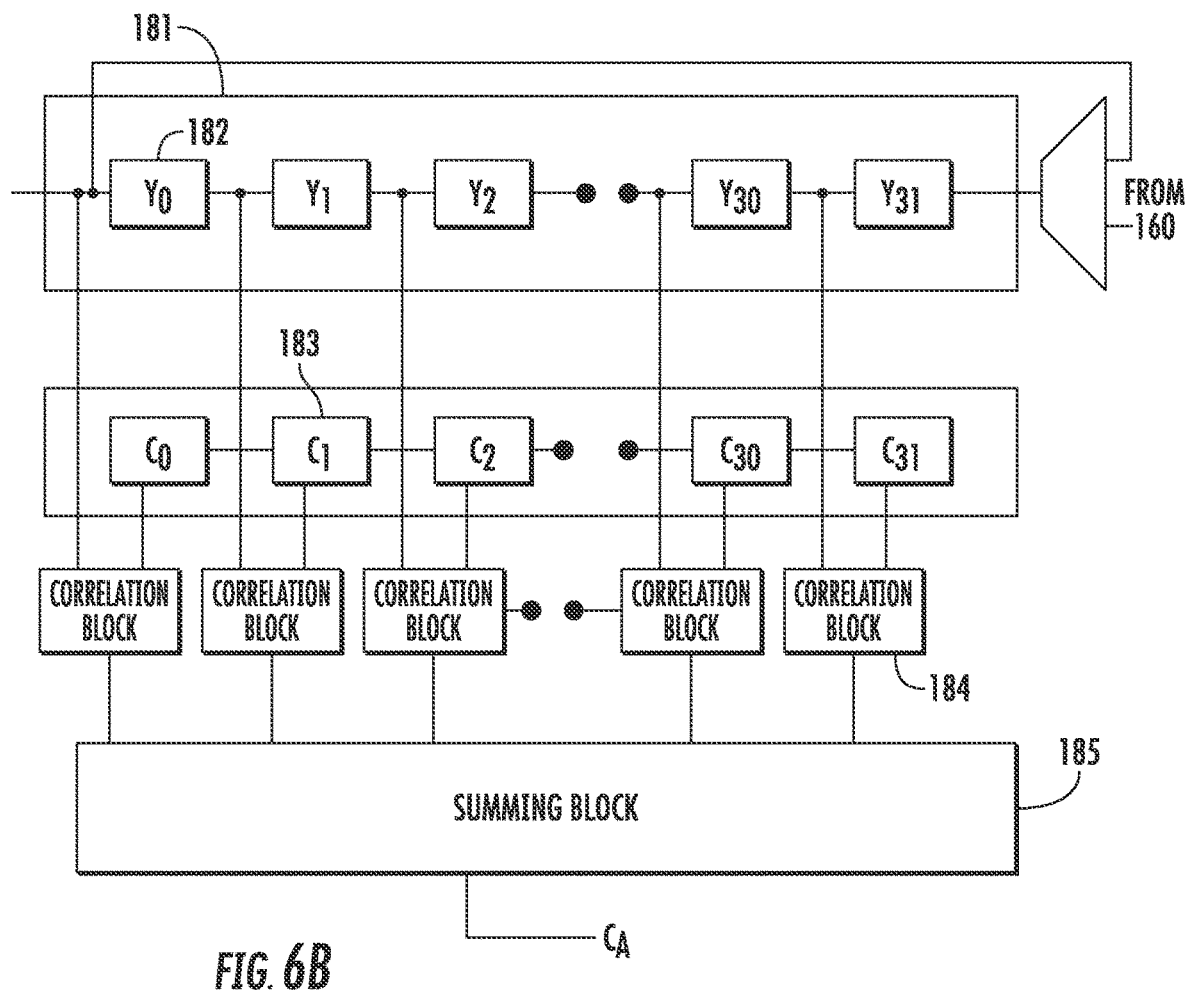

After each cyclic shift, the correlator in the preamble detector 180 then compares the correlator content (Y[31:0]) with the predetermined pattern as defined by the correlation coefficients (C[31:0]) to develop a correlation value $C_A$, and compares it with a threshold TH, as shown in Box 340. Instead of a cyclic shift of correlation coefficients, a cyclic shift of the correlator content (i.e., the received fragment, Y[31:0]) may be used which would provide identical correlation results. This is shown in FIG. 6B.

If a match is found ($C_A$ exceeded the threshold TH), the preamble is detected, as shown in Box 370. However, if no match is found, the preamble detector 180 checks if the cyclic shift completed the number of samples equal to the length of a repeating pattern, as shown in Box 350. If not, the preamble detector repeats Boxes 330-350. Conversely, if the cyclic shift is completed, the receiver will start receiving a next received fragment and load samples of the new received fragment into the memory device 170 and the correlator as shown in Box 300. As new samples are loaded into the data shift register 181, old samples from the previous received fragment are discarded. The whole process shown in Boxes 300-360 is repeated until the preamble is detected. The rate at which the first loop is running (i.e., Boxes 300-320) is limited by the rate at which samples are received. The rate used to run the second loop (i.e., Boxes 330-350) may be much higher as it is reusing samples already received and stored in memory. This memory could be memory device 170 or memory embedded in the correlator. The rate used for running the second loop may be derived from the crystal oscillator, an RC oscillator, an LC oscillator, the frequency synthesizer or a ring oscillator.

Figure 5B:
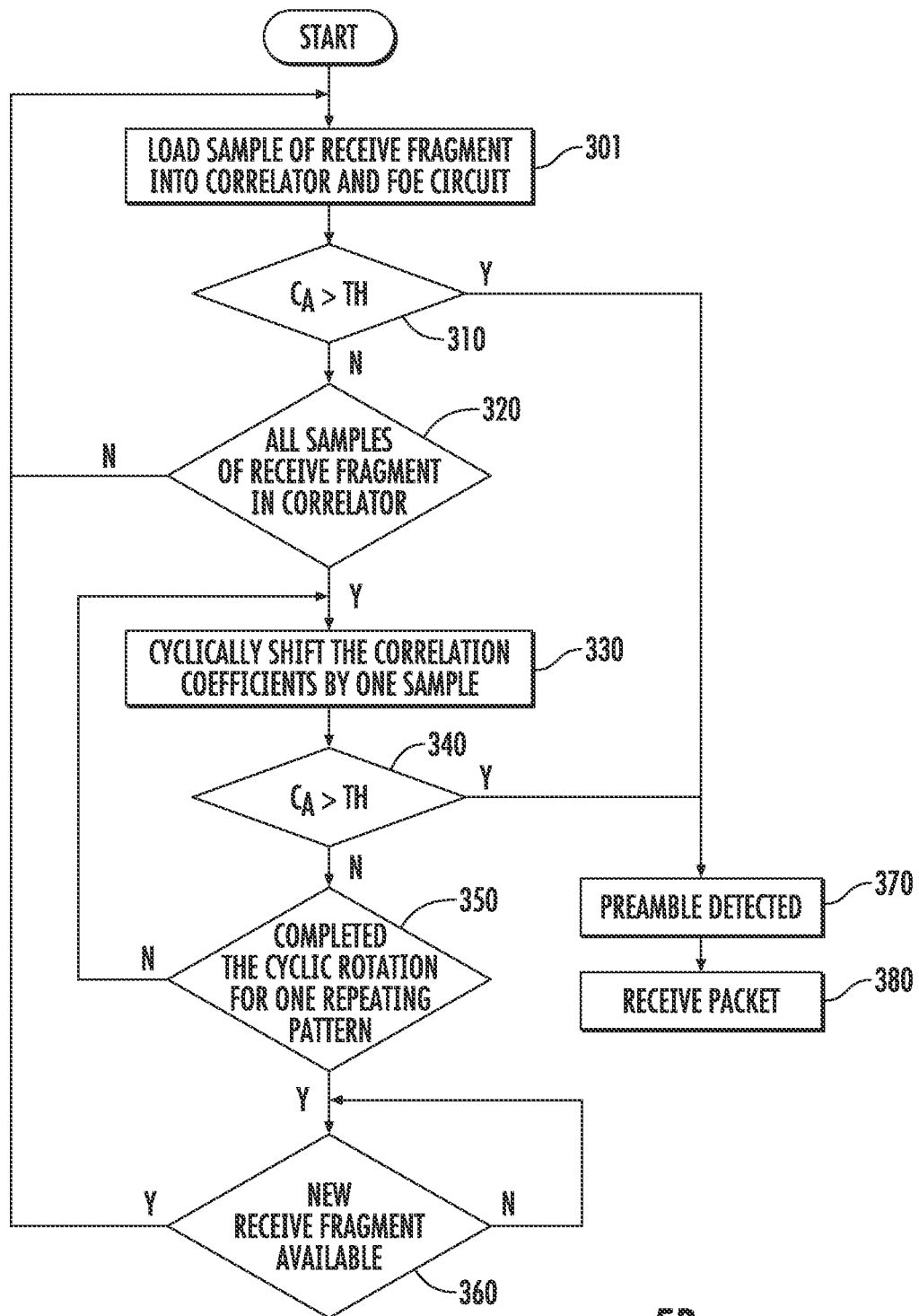

There are variations of the flowchart shown in FIG. 5A. For example, in certain embodiments, the receiver 100 may also include a frequency offset estimation (FOE) circuit. Many of the steps in the sequence shown in FIG. 5B are the same as those in FIG. 5A and have been given identical reference designators. The only change is in Box 301, where the incoming sample from the received fragment is also loaded into the FOE circuit. The Frequency Offset Estimation value may be used to compensate for the frequency offset, for example, in the preamble detector 180 or the demodulator 190.

Thus, looking at the flow chart in FIG. 5A, it can be seen that the first loop (Boxes 300-320) is used to detect at least one pattern that spans across multiple adjacent received fragments. The second loop (Boxes 330-350) are used to detect at least one pattern that is misaligned within a single received fragment.

Using FIG. 3A as an example, it can be seen that the first received fragment ($R_{i-1}$) does not contain the desired pattern. Thus, after the first loop is completed, there is no preamble detected. Furthermore, rotating the first received fragment will also not result in preamble detection, since part of the first received fragment contains noise. Thus, the second loop cannot be used to find the desired pattern. However, as the second received fragment ($R_i$) is shifted into the shift register during the first loop, there is a point at which the data in the data shift register 181 matches the correlation coefficients 183, resulting in preamble detection.

Using FIG. 3B as an example, it can be seen that as the first received fragment ($R_i$) is shifted into the data shift register 181, a preamble is not detected, however, as the correlation coefficients are rotated, the desired pattern can be detected. Thus, the second loop detects the desired pattern within a received fragment.

Figure 5C:
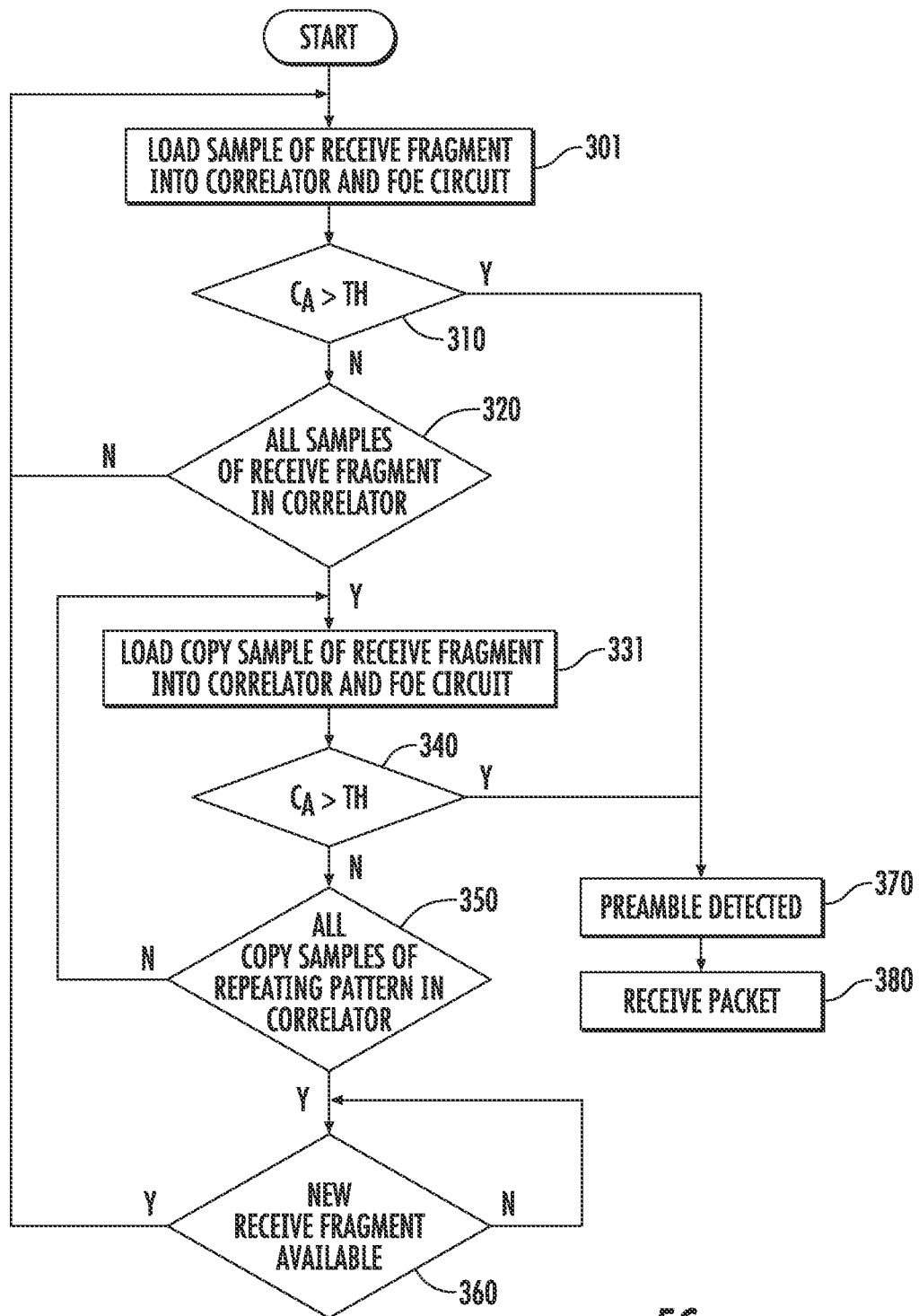
Figure 6C:
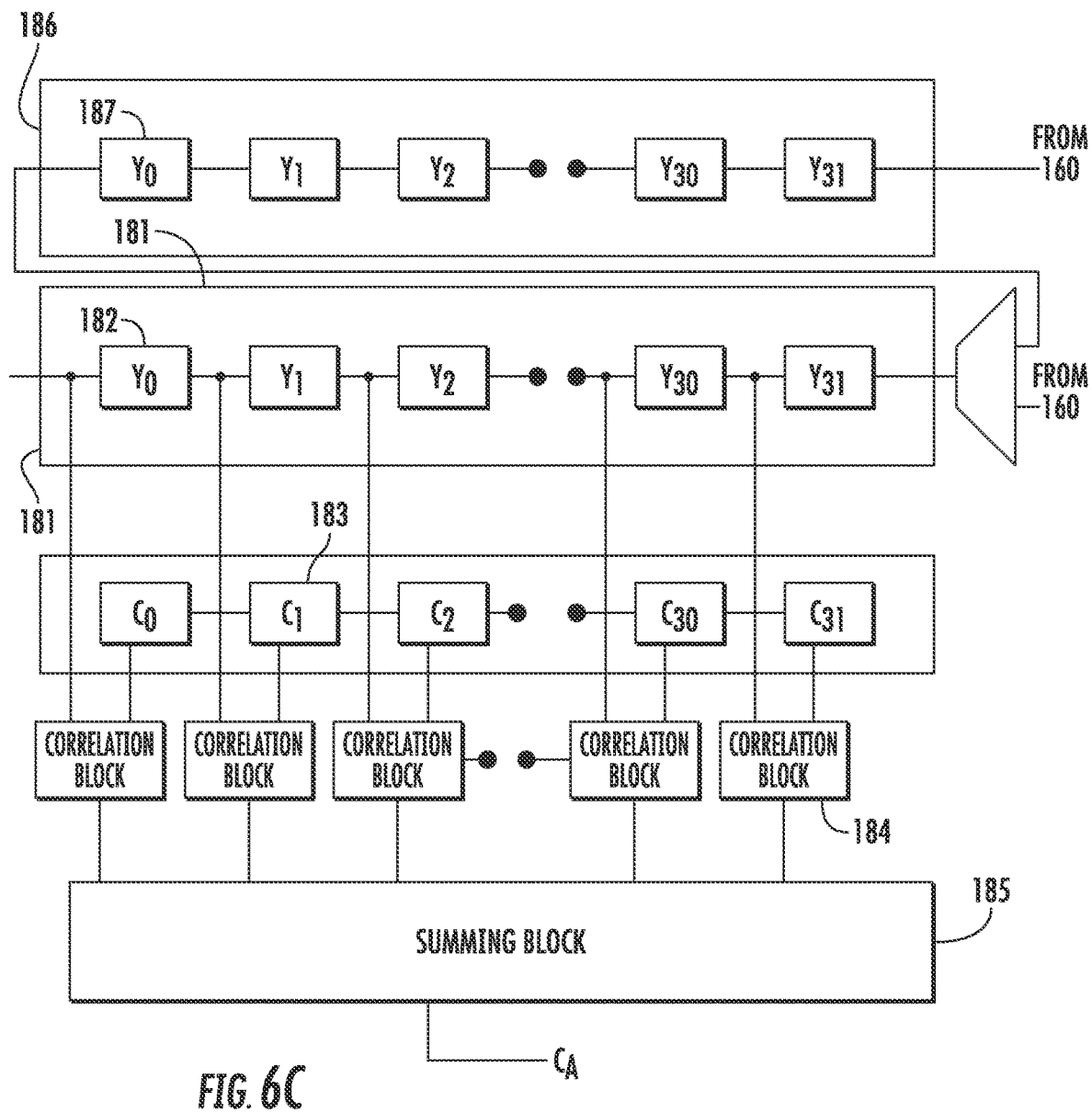

While FIGS. 5A-5B and 6A-6B rely on the rotation of the correlation coefficients or the received fragment, other techniques may also be used. For example, instead of rotating the correlator content in the data shift register 181 or the correlation coefficients in the coefficient register, a second copy of the received fragment may be fed into the data shift register 181. FIG. 6C shows this embodiment where a second data shift register 186, which comprises the same number of registers 187 as in the data shift register 181. Instead of performing a rotation, as was done in FIGS. 5A-5B and 6A-6B, the saved copy of the received fragment from the second data shift register 186 is directed into the data shift register 181. This introduction of a saved copy into the data shift register 181 performs the same function as rotating the contents within the data shift register 181 or rotating the correlation coefficients 183. The flowchart associated with FIG. 6C is shown in FIG. 5C. This flowchart is identical to that shown in FIG. 5B, except that Box 331 replaces Box 330. Thus, instead of performing a cyclic shift, samples from the saved fragment are loaded into the data shift register 181.

In each of these embodiments, the coefficient register is loaded with correlation coefficients 183. This may be done by loading a correlation coefficient into each individual register. In another embodiment, the coefficient register is a shift register, such that all correlation coefficients are loaded into the same register and then the correlation coefficients are shifted to the proper position.

Figure 7A:
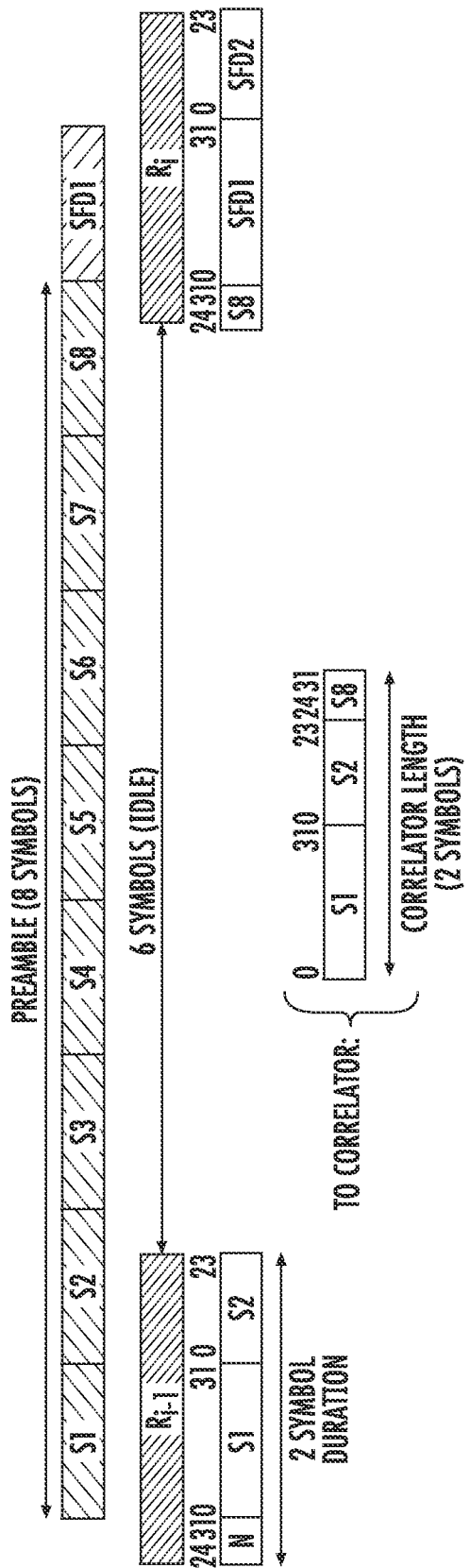
FIGS. 7A-7B show scenarios where the received fragments are two symbols in length and the preamble detector requires two symbols to detect the preamble.
Figure 7B:
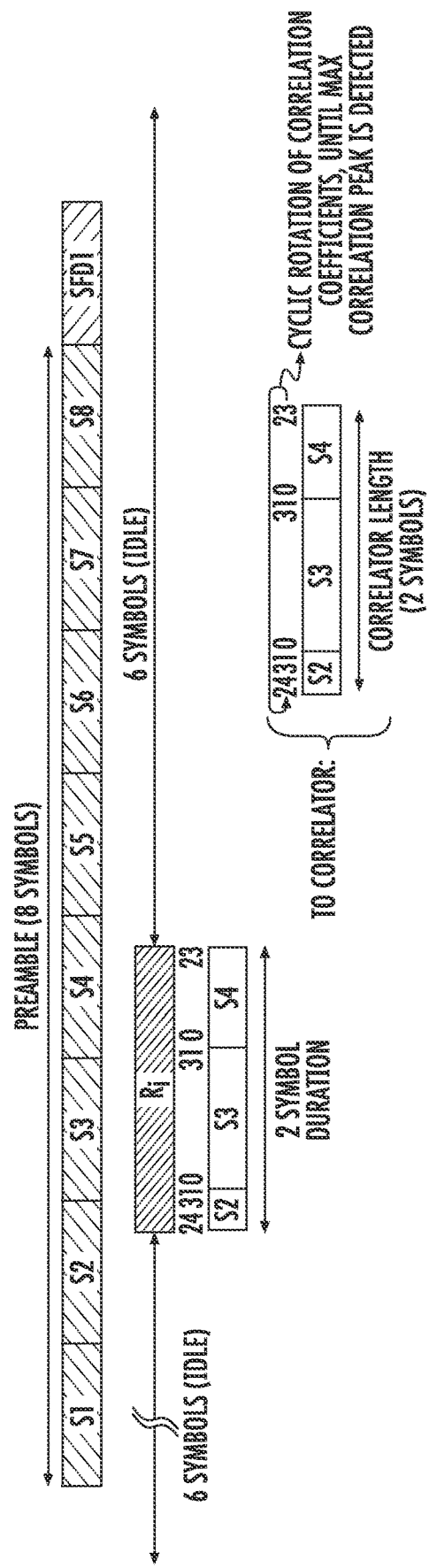

While FIGS. 3A and 3B show the length of the received fragment being the same as the length of the symbol, other embodiments are possible. FIGS. 7A-7B shows an example that is based on the O-QPSK PHY, as specified in IEEE 802.15.4-2020. However, in this embodiment, the received fragments have a length equal to the length of two symbols, suitable for a correlation length of two symbols. Note that the flowcharts shown in FIGS. 5A, 5B and 5C also provide a detected preamble when the length of the received fragment is greater than the length of one symbol. In fact, it can be shown that the allowable idle time may be given by the following equation:

$$IT=(P-N*R)/N,$$

where IT is idle time, P is the preamble length, R is the length of one received fragment, and N is the maximum number of received fragments that can fit within the preamble field, considering that the fragments are separation by the idle time IT. All lengths are expressed in the same units, such as symbols, repetition patterns, bits, or another unit. N*R is also the length that is available for detection of the preamble and thus, the length of the correlator could be equal to N*R. The equation could also be rewritten as:

$$P=N(IT+R),$$

where this equation indicates that the duration of an integral number (N) of idle times added to the duration of a same integral number (N) of received fragments, is equal to the duration of the preamble field. For example, in FIGS. 7A and 7B, the integral number is "one" (N=1) because the duration of one idle time (6 symbols) added to the duration of one received fragment (2 symbols) is 8 symbols which is the same duration as the preamble. This dimensioning provides some interesting benefits, such as reduced complexity and efficient use of the available preamble length which allows for extended idle times and lower duty cycles. The benefit of extended idle times can be power savings when a low power mode is enabled during the idle time, or more processing time availability. The extended processing time could be useful to scan more antennas in antenna diversity applications, or to scan more channels in a multi-channel application or to scan more PHY modes in a multi-PHY mode application. Any combinations of the aforementioned applications are also possible, like searching for packets on multiple channels using Bluetooth or Thread. Note that in this disclosure, the terms "duration" and "length" may be used interchangeably.

Applying this equation to the scenarios shown in FIGS. 7A-7B, it can be seen that the idle time can be 6 symbols if the preamble length is 8 symbols, the fragment is two symbols in length and the preamble detector (correlation length) requires 2 symbols. In the scenario of FIG. 7A, the preamble can be detected in the first loop while receiving fragment $R_i$, as illustrated by Boxes 300-320 in FIG. 5A, while in the scenario of FIG. 7B, the second loop, as illustrated by Boxes 340-360 in FIG. 5A, is needed to detect the preamble.

Figure 8A:
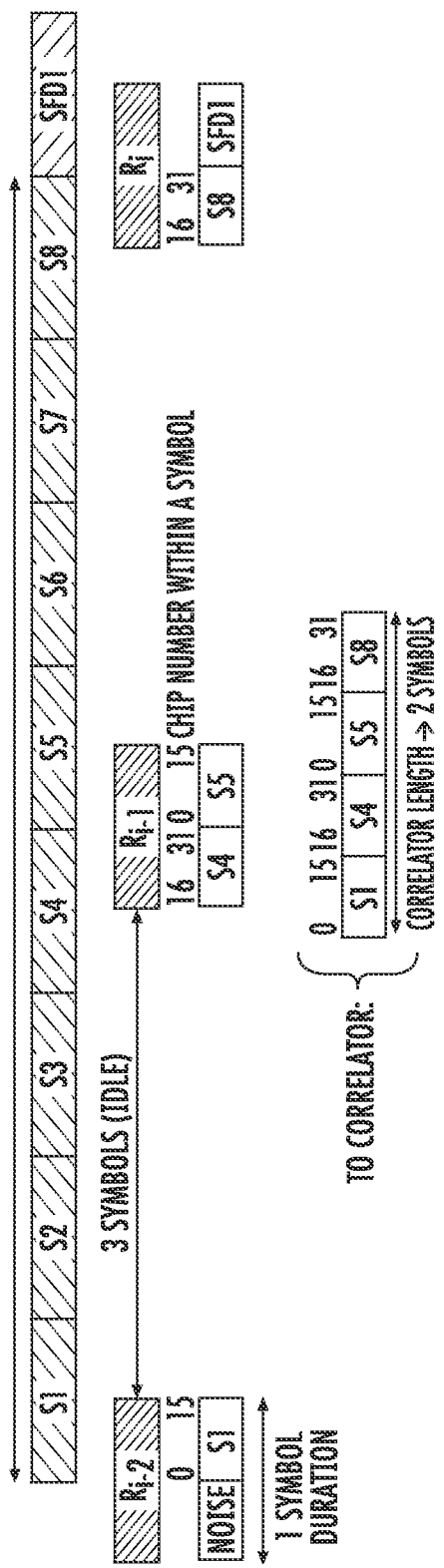
FIGS. 8A-8B show scenarios where the received fragments are one symbol in length and the preamble detector requires two symbols to detect the preamble.
Figure 8B:
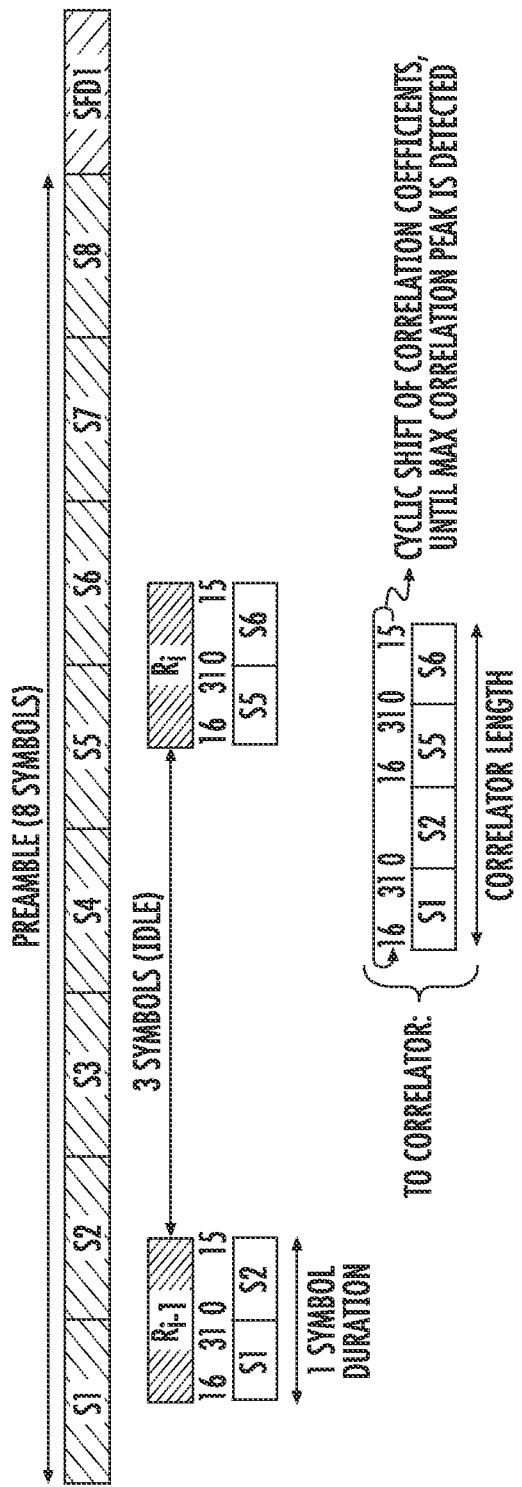

FIGS. 8A-8B show another embodiment wherein the preamble detector requires 2 symbols for detection, but the length of the received fragment is only one symbol in length. This scenario may also be based on the O-QPSK PHY, as specified in IEEE 802.15.4-2020. Note that in this embodiment, two fragments must appear in the preamble. Referring to the formula, N=2, R=1 symbol and P=8 symbols, resulting in an Idle Time (IT) of 3 symbols. FIG. 8A shows the scenario where only one received fragment is entirely within the preamble field and two other received fragments are only partially within the preamble field. In the scenario of FIG. 8A, the preamble can be detected in the first loop while receiving fragment $R_i$, as illustrated by Boxes 300-320 in FIG. 5A. FIG. 8B shows the scenario where two received fragments are completely within the preamble field, requiring the second loop, as illustrated by Boxes 340-360 in FIG. 5A, to detect the preamble. Note that the correlator length may be greater than the length of one received fragment. Thus, the correlator content may be at least one received fragment.

In both FIGS. 7A-7B and 8A-8B, the duty cycle of the receiver is only 25%, compared to the prior art, where the duty cycle needs to be 50% to guarantee that the preamble is detected.

Figure 9:
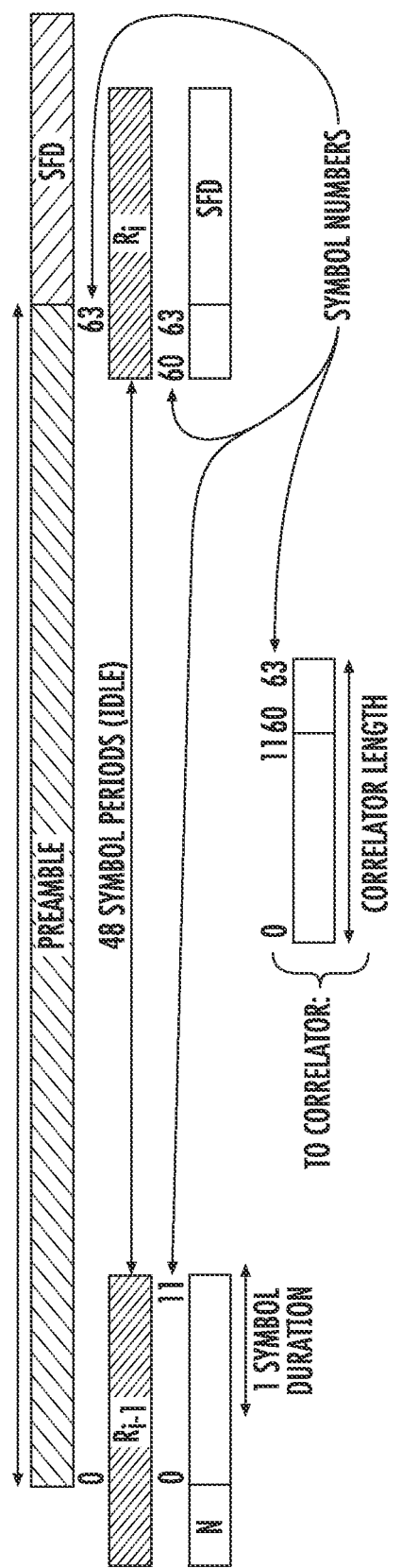
FIG. 9 shows a scenario where the received fragment is 16 symbols in length.

FIG. 9 shows another scenario which is based on SUN-FSK PHY per IEEE 802.15.4-2020. In this embodiment, the preamble is defined as an alternating pattern of ones and zeros. In this embodiment, a repeating pattern may be the same as two consecutive bits. In certain embodiments, the preamble detector requires 16 bits to detect the preamble. If the preamble field is 64 symbols in length, the received fragment is 16 bits and the number of received fragments that can fit during the preamble is one, using the above equation, it can be seen that the idle time can be 48 bits. In other words, the preamble can be detected if the duty cycle is only 25%. The prior art typically requires 50% duty cycle. FIG. 9 shows scenario when the receiver 100 is active starting 4 symbol periods before the preamble field. Thus, the first received fragment $R_{i-1}$ only contains 12 symbols that are part of the preamble. The last four symbols in the preamble field are contained in received fragment $R_i$. These last four symbols are appended to the first 12 symbols as contained in the received fragment $R_{i-1}$ to form 16 complete symbols suitable for preamble detection.

The previous scenarios were directed to single antenna configurations where the receiver was placed in a low power mode when not receiving a fragment. However, the preamble detector 180 described herein is equally applicable to scenarios where multiple antennas are used. In some embodiments, the receiver selects one of the multiple antennas based on the best reception, which may be measured by signal strength, correlation value or lowest noise. In other embodiments, the preamble detector 180 described herein is equally applicable to receive packets on multiple channels. The following examples illustrate the use of the preamble detector in these situations. Since the preamble detector 180 may use previously received fragments, the data shift register 181 may need to be duplicated to support multiple antenna or multiple channels. Alternatively, the preamble detector 180 could be duplicated in its entirely to support an extra antenna or channel.

Figure 10:
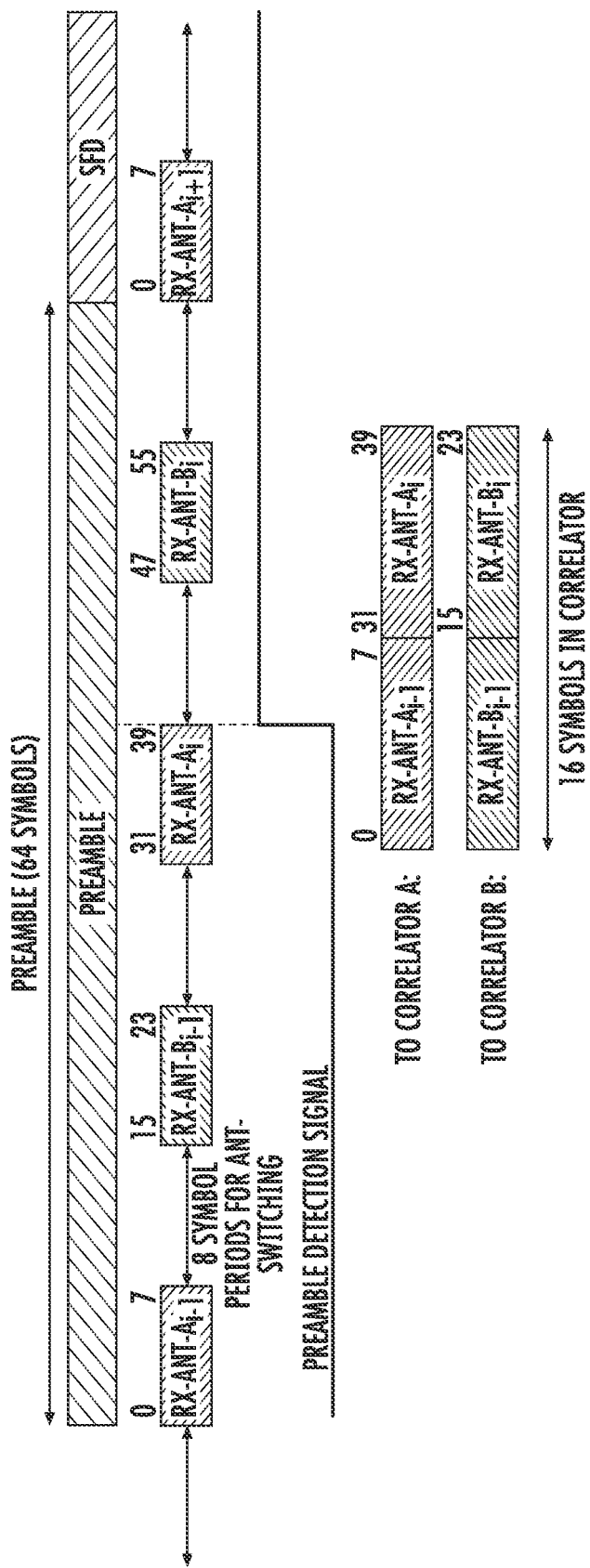
FIG. 10 shows a scenario using antenna diversity.

FIG. 10 shows a scenario where there are two antennas and the receiver is attempting to detect preamble and also attempting to determine which antenna to use to receive the packet. In this embodiment, the SUN-FSK PHY is used in accordance with IEEE 802.15.4-2020. The preamble has a length of 64 symbols, where the pattern is alternating ones and zeros. In this embodiment, the preamble detector 180 requires 16 symbols to detect the preamble. Further, the received fragments are each 8 symbols in length and there is a gap of 8 symbols between received fragments to allow for antenna switching. In this embodiment, the idle time is set such that two received fragments are present in the preamble field for each antenna. Note that also in this scenario the formula applies to the timing of the received fragments and the Idle Time per antenna. P=64, N=2, R=8, resulting in an idle time of 24 symbols per selected antenna. This idle time allows for receiving fragments on two antennas by using the idle time associated with one antenna to receive a fragment on another antenna.

Figure 11A:
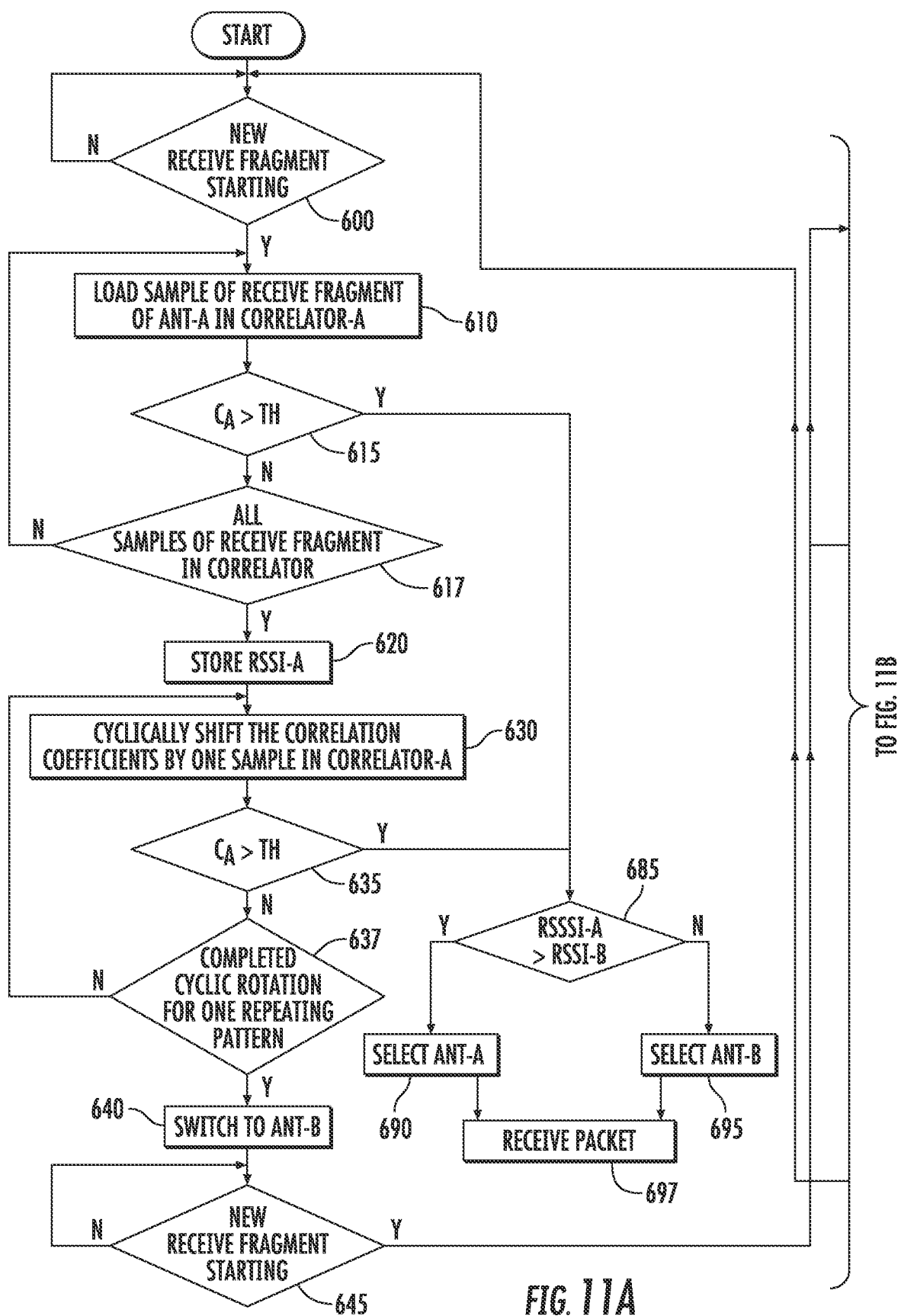
FIGS. 11A-11B show the operation of the preamble detector when using antenna diversity.
Figure 11B:
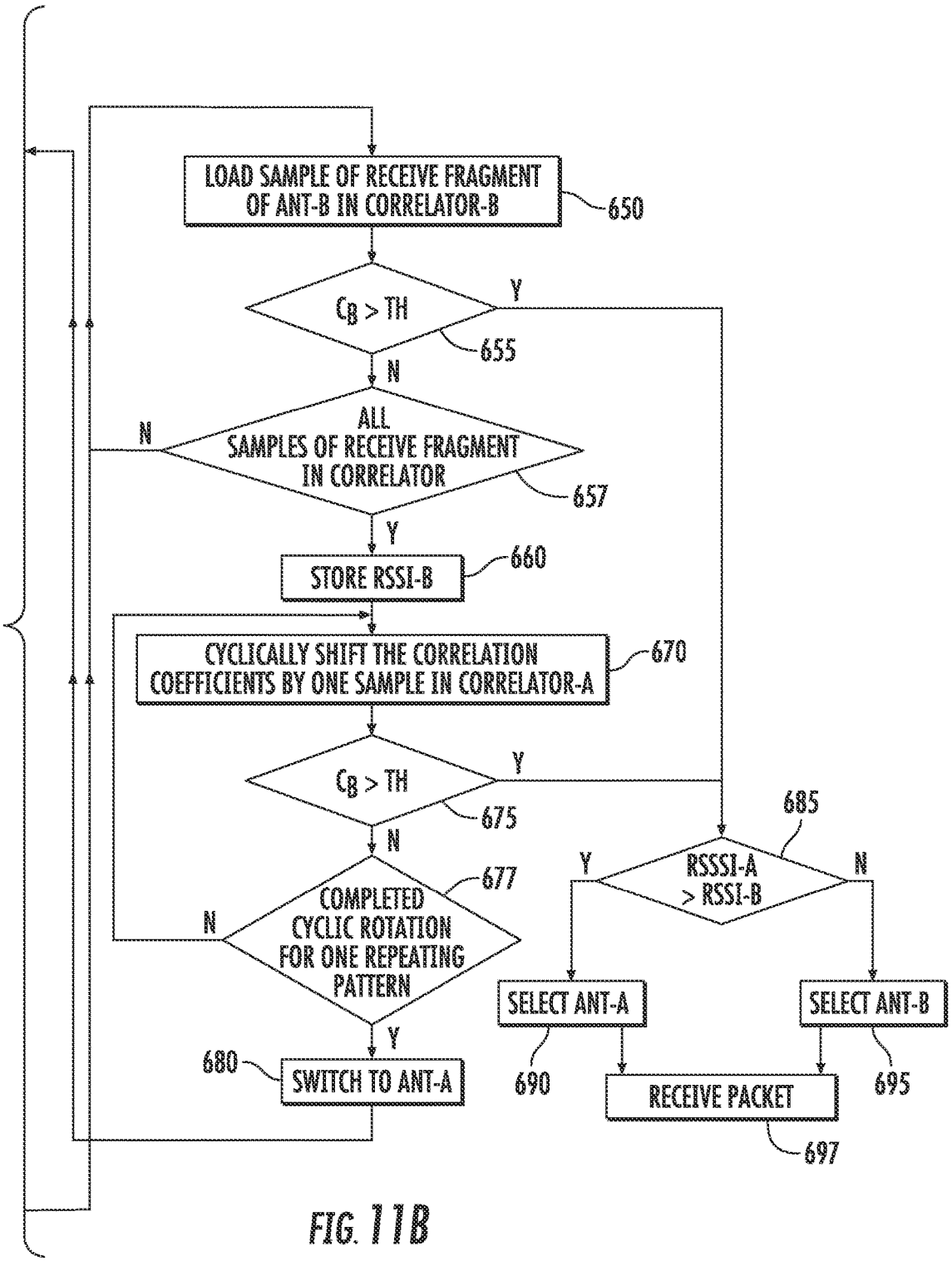

In this embodiment, there are two correlators in the preamble detector; one associated with each antenna. Further, these correlators may work in the same manner as those described in FIGS. 5A-5C. FIGS. 11A-11B show the flowchart of this embodiment. Many of the steps in the sequence shown in FIGS. 11A-11B are similar as those in FIG. 5A.

FIGS. 11A-11B show a flow chart for detecting the preamble and selecting one of the two antennae. First, as shown in Box 600, the preamble detector waits for a fragment to start. As samples are received from the signal transformation block 160, they are loaded into the correlator associated with the first antenna (Correlator-A), as shown in Box 610. After loading a sample into the correlator, the correlator content, as stored in data shift register 181, is then compared to the predetermined pattern to develop a correlation result $C_A$. In Box 615, it is checked if the correlation result $C_A$ is greater than a predetermined threshold, in which case the preamble is detected. In certain embodiments, the threshold, TH, is 70%.

If the correlator-A does not indicate that the preamble has been detected, the preamble detector checks if all of the samples from the fragment have been received, as shown in Box 617. For example, the preamble detector may utilize a counter to track the number of samples that have been received. If all samples from the fragment have not been received, the previous Boxes 610-617 are repeated. If, however, all of the samples from the fragment have been received, the received signal strength indicator (RSSI) from the signal received by antenna-A is stored, as shown in Box 620. The preamble detector performs a cyclic shift of the correlation coefficients, as shown in Box 630. As described with respect to FIG. 5A, the cyclic shift may be performed using the receiver sample clock or a higher frequency clock.

After each cyclic shift in Box 630, the correlator in the preamble detector 180 compares the shifted correlation coefficients with the received fragment and provides a correlation result $C_A$. The preamble is detected when $C_A$ exceeds the detection threshold TH, as shown in Box 635.

However, if the preamble is not detected, the preamble detector 180 checks if the cyclic shift is completed, as shown in Box 637. The cyclic shift is complete when the correlation coefficients have been shifted N−1 times, where N is at least the length of the repeating pattern. If the cyclic shift is not complete, the preamble detector repeats Boxes 630-637. If the cyclic shift has completed without preamble detection, the preamble detector switches to the second antenna, as shown in Box 640. The preamble detector then waits until the next fragment starts, as shown in Box 645.

The sequence described above with respect to the first antenna is then repeated for the second antenna (Ant-B), as shown in Boxes 650, 655, 657, 660, 670, 675 and 677. When the received fragment is from the second antenna, the RSSI for the second antenna is stored, as shown in Box 660. If the cyclic shift has completed without preamble detection, the preamble detector switches back to the first antenna (Ant-A), as shown in Box 680. The preamble detector then waits until the next fragment starts, as shown in Box 600.

Note that Boxes 615, 635, 655 and 675 are all used to check if a preamble is detected. In certain embodiments, once the preamble is detected, the preamble detector may select the best antenna to use to receive the packet. For example, as shown in Box 685, the preamble detector may compare the RSSI from the first antenna to the RSSI from the second antenna. The antenna with the higher RSSI is then selected, as shown in Boxes 690, 695. After the appropriate antenna is selected, the packet is received, as shown in Box 697. Alternatively, in another embodiment which is not shown in FIGS. 11A-11B, the RSSI of only one received frame may be used. For example, if the RSSI associated with the successful preamble detection exceeds a predetermined threshold, then the antenna used for the successful detection may be used to receive the remainder of the packet. Thus, in this embodiment, the RSSI of the two received fragments may not be compared.

In each of these examples, the length of each received fragment and the idle time are an integral number of symbols. In this way, two adjacent received fragments may be correctly stitched together. Further, a received fragment may be compared to the correlation coefficients while they are cyclically shifted. This is possible because the received fragment and the next received fragment starts at the same position within a symbol. However, in certain embodiments, the received fragment length is not an integral number of symbols.

In certain embodiments, the idle time has to be an integral number of symbols. For example, if the idle time is not an integral number of symbols, two consecutive symbols cannot be seamlessly appended to one another. Thus, in certain embodiments, the idle time, which is defined as the time between the end of one received fragment and the start of the next received fragment, from the same antenna, must be an integral number of symbols.

Figure 12:
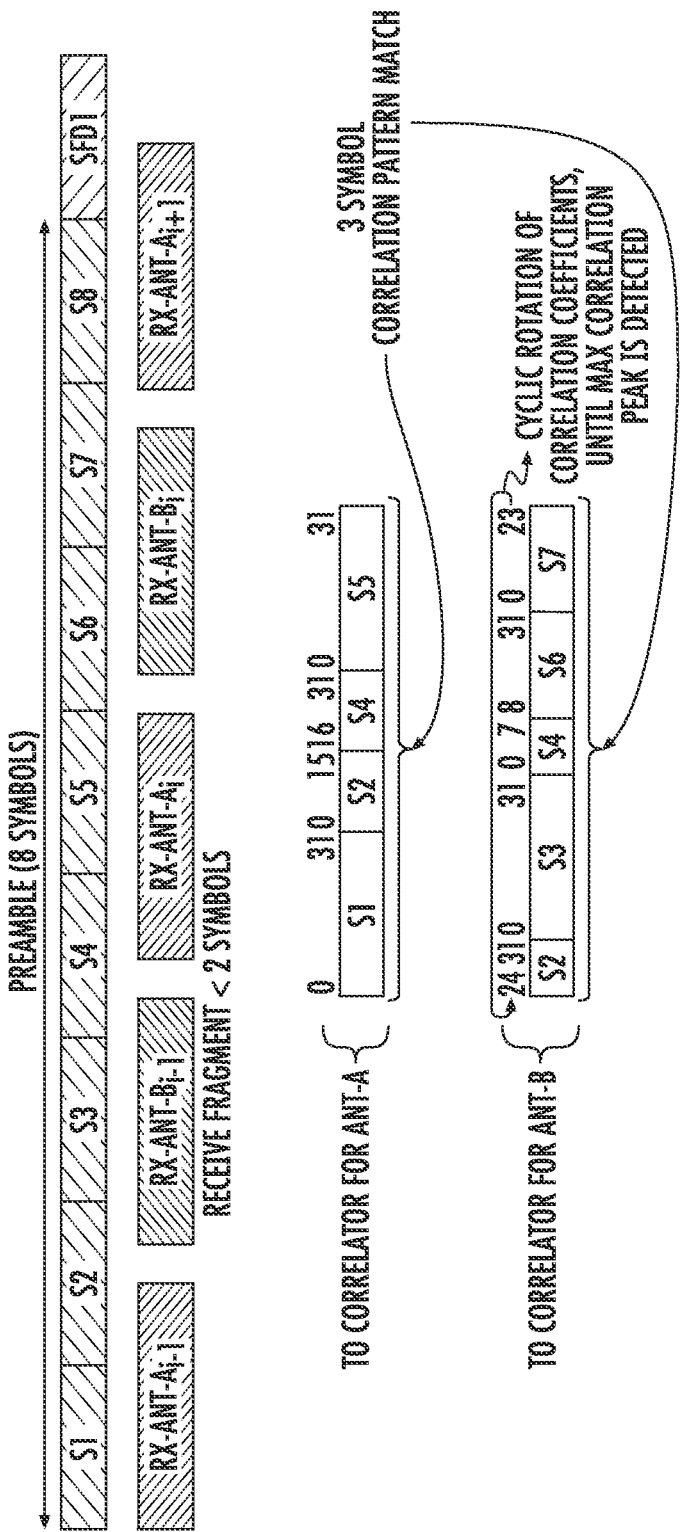
FIG. 12 shows a scenario where the received fragments have a length equal to 1.5 symbols.

FIG. 12 shows a scenario using the O-QPSK PHY as specified in IEEE 802.15.4-2020, where there are two antennas and the receiver is attempting to detect preamble and also attempting to determine which antenna to use to receive the packet. The received fragments are 1.5 symbols in length and the idle time between received fragments from the same antenna is 2 symbols. In this scenario, the preamble detector requires 3 symbols to detect the preamble. Further, each received fragment is 1.5 symbols in length. The idle time between adjacent received fragments is 0.25 symbols and the idle time between received fragments from the same antenna is 2 symbols.

In this particular example, the received fragment RX-ANT-$A_{i-1}$ is aligned with the symbols and starts at sample 0 of the first symbol. Since the fragment is 1.5 symbols and the idle time is symbols, the received fragment RX-ANT-$B_{i-1}$ will begin ¾ of the way through the second symbol. In other words, the received fragment RX-ANT-$B_{i-1}$ will begin at sample 24 (i.e., ¾ of 32 samples). Likewise, the received fragment RX-ANT-$A_i$ will begin ½ of the way through the fourth symbol and the received fragment RX-ANT-$B_i$ will begin ¼ of the way through the sixth symbol.

Note that adjacent received fragments from the same antenna can be appended to one another, as the samples will be contiguous. In other words, as shown in FIG. 12, the correlator may receive received fragment RX-ANT-$B_{i-1}$ and received fragment RX-ANT-$B_i$.

In this embodiment, since the received fragment is not an integral number of symbols, the cyclic shifting cannot be performed until after the second received fragment is appended to the first received fragment.

Figure 13:
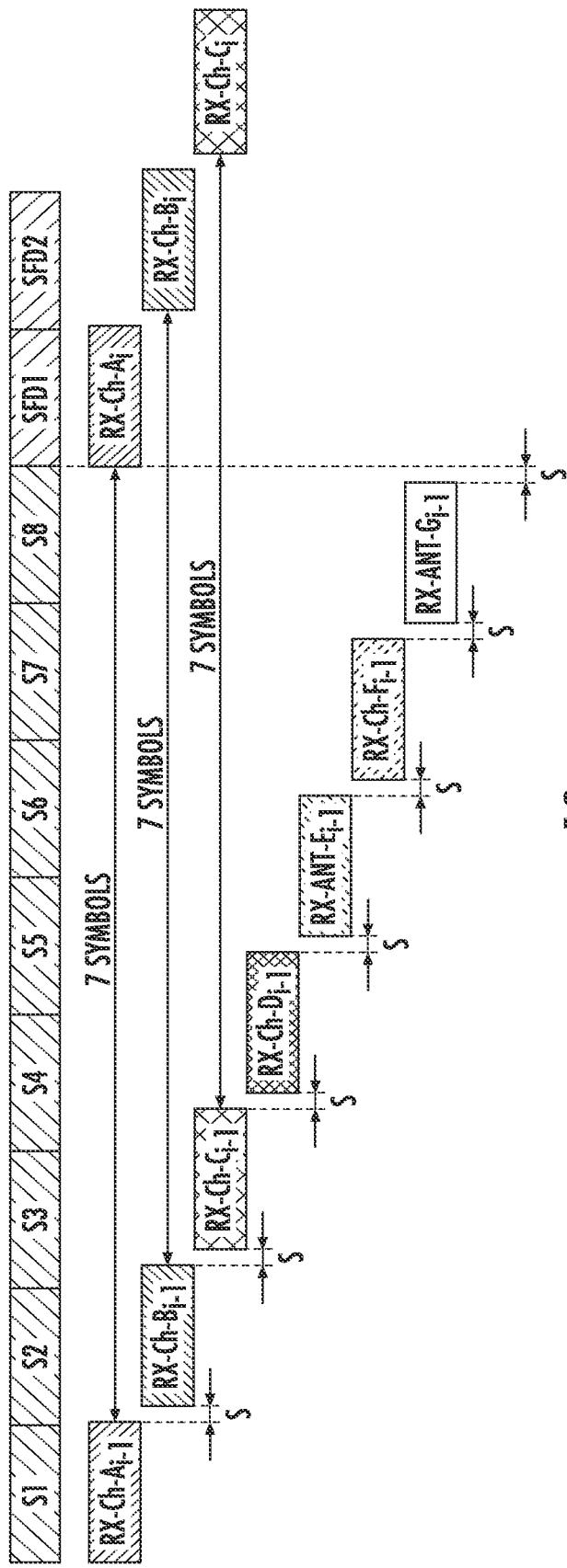
FIG. 13 shows a scenario where the receiver monitors a plurality of channels and the receiver cycles between these channels.

FIG. 13 shows a scenario where the receiver is used for multichannel detection. In this example, there are 7 channels. The receiver may have seven separate preamble detectors or correlators, where each operates like that shown in FIGS. 3A-3B. If the preamble field has a length of 8 symbols and each fragment has a length of one symbol, the total idle time is seven symbols per channel. The switching time is labelled S in FIG. 13. This switching time is inserted to allow for the receiver settling time. This includes the frequency change (changing channels), AGC settling, as well as propagation delay in the receiver. If each symbol has 32 samples, then the maximum switching time, with all switching times equal, can be 32 samples/7. It may be convenient to use an integral number of samples. This can be done, for example, by having a switching time of 4 samples (i.e., ⅛ of a symbol) and inserting a correction switching time when transitioning from the seventh antenna back to the first antenna of 8 samples (i.e., ¼ of a symbol) so that all fragments that are received from a particular channel can be contiguously stitched together.

Figure 14:
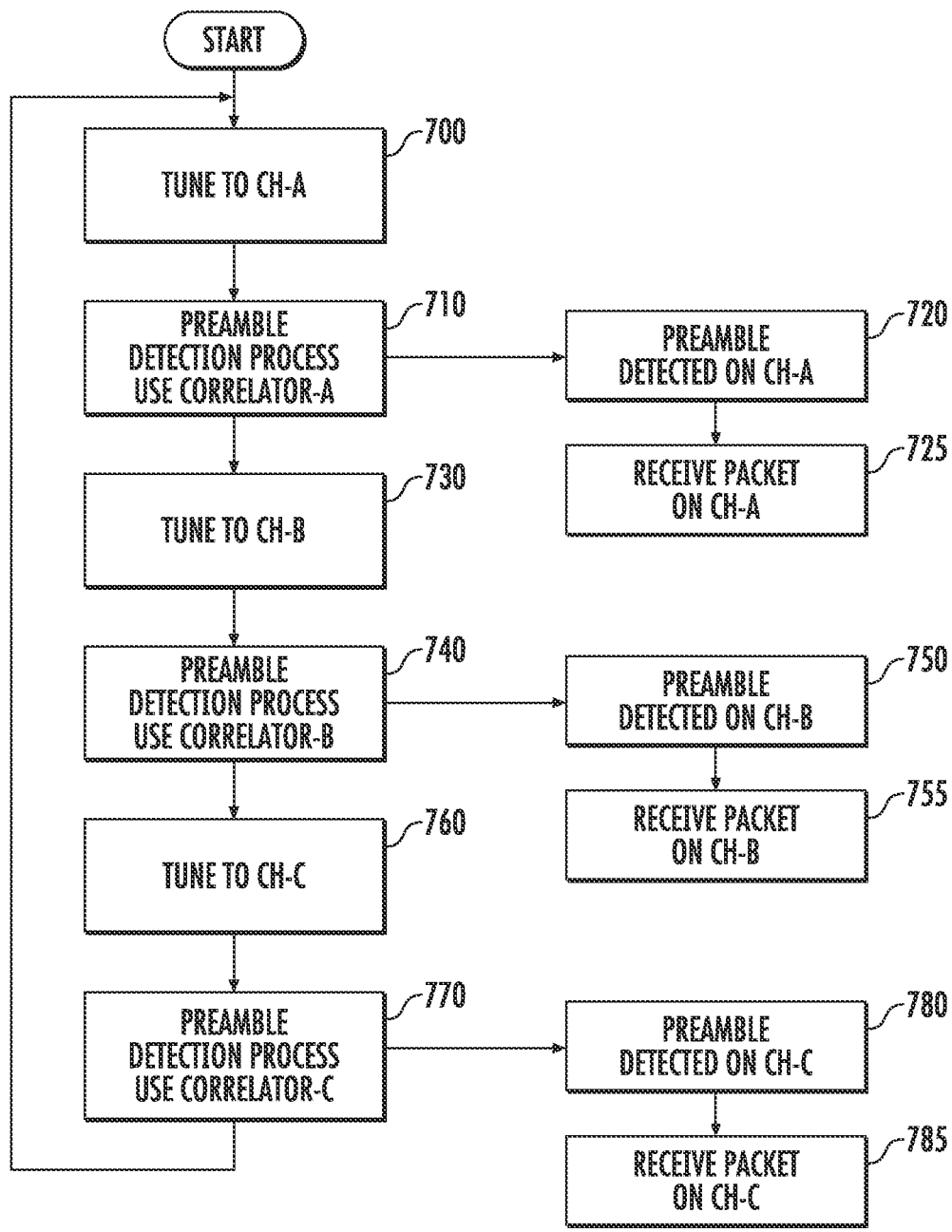
FIG. 14 shows the operation of the preamble detector when monitoring three channels.

FIG. 14 shows a flowchart that illustrates the operation of a receiver that are used to monitor three different channels. First, as shown in Box 700, the controller 200 tunes the frequency synthesizer 125 to a first channel, Channel A. The preamble detection process, similar to that shown in FIGS. 5A, 5B and 5C is then executed for this channel, as shown in Box 710. If preamble is detected on Channel A, as shown in Box 720, then the controller 200 configures receiver 100 to receive the packet on Channel A, as shown in Box 725. If preamble is not found on Channel A, the controller 200 tunes the frequency synthesizer 125 to the second channel, Channel B, as shown in Box 730. The preamble detection process then executed for this channel, as shown in Box 740. If preamble is detected on Channel B, as shown in Box 750, then the controller 200 configures receiver 100 to receive the packet on Channel B, as shown in Box 755. If preamble is not found on Channel B, the controller 200 tunes the read circuit to the third channel, Channel C, as shown in Box 760. The preamble detection process then executed for this channel, as shown in Box 770. If preamble is detected on Channel C, as shown in Box 780, then the controller 200 configures receiver 100 to receive the packet on Channel C, as shown in Box 785. If preamble is not found on Channel C, the controller 200 tunes the frequency synthesizer 125 to the first channel, Channel A, as shown in Box 700. The entire sequence is then repeated.

The examples herein present different modulation schemes. It is understood that the system and method described herein is also applicable to other modulation schemes, such as OFDM. In OFDM, a short training field (STF), which usually consists of repeating patterns, is used to detect the preamble. Using the system, these repeating patterns may be skipped in idle mode and consecutive received fragments may be stitched together to form a contiguous pattern, as described above. This system is also suitable for 8 phase shift keying (8 PSK), differential phase shift keying (DPSK), amplitude shift keying (ASK), on-off keying (OOK), quadrature amplitude modulation (QAM), minimum shift keying (MSK), Gaussian minimum shift keying (GMSK), Gaussian frequency shift keying (GFSK) and others.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for receiving a packet on a wireless network, wherein the packet includes a preamble field where a preamble is located, wherein the preamble is made up of a plurality of identical patterns, the apparatus comprising:
an antenna to receive a signal containing the packet;
an RF circuit to process the signal and create one or more received fragments; and
a preamble detector to detect a preamble based on at least one pattern in at least one received fragment of the one or more received fragments, wherein each received fragment is at least one pattern in duration, and is spaced from a subsequent received fragment by an idle time.

2. The apparatus of claim 1, wherein the at least one received fragment is stored in the preamble detector as correlator content and wherein the preamble detector detects the at least one pattern either while the received fragment is being received, or during the idle time by cyclically shifting correlation coefficients relative to the correlator content.

3. The apparatus of claim 2, wherein the preamble detector comprises a correlator and the correlator operates at a first rate while receiving a received fragment and at a second rate when cyclically shifting the correlation coefficients relative to the correlator content and wherein the second rate is higher than the first rate.

4. The apparatus of claim 2, wherein the preamble detector comprises a cost function engine.

5. The apparatus of claim 1, wherein a duration of an integral number of idle times added to a duration of a same integral number of received fragments, is equal to a duration of the preamble field.

6. The apparatus of claim 1, wherein a duration of the idle time is equal to a duration of an integral number of patterns.

7. The apparatus of claim 1, wherein the preamble detector is configured to detect the at least one pattern, wherein the at least one pattern spans across multiple received fragments.

8. The apparatus of claim 1, wherein the preamble detector is configured to detect the at least one pattern, wherein the at least one pattern is misaligned within at least one received fragment.

9. The apparatus of claim 8, wherein the preamble detector comprises a data shift register to hold the at least one received fragment and a coefficient register to hold correlation coefficients, wherein the preamble detector cyclically shifts the correlation coefficients relative to the at least one received fragment to detect the at least one pattern.

10. The apparatus of claim 9, wherein the coefficient register is a cyclic shift register, and wherein the preamble detector cyclically shifts the correlation coefficients within the coefficient shift register to detect the at least one pattern.

11. The apparatus of claim 9, wherein the data shift register is a cyclic shift register and wherein the preamble detector cyclically shifts the at least one received fragment within the data shift register to detect the at least one pattern.

12. The apparatus of claim 9, wherein the preamble detector comprises a second data shift register to hold the received fragment and the cyclically shifting of the correlation coefficients relative to the at least one received fragment is performed by shifting samples from the second data shift register into the data shift register.

13. An apparatus for receiving a packet on one of a plurality of channels on a wireless network, wherein the packet includes a preamble field where a preamble is located, wherein the preamble is made up of a plurality of identical patterns, the apparatus comprising:
an antenna to receive a signal containing the packet;
an RF circuit to process the signal and create one or more received fragments from each of the plurality of channels; and
a preamble detector comprising a plurality of correlators to detect a preamble based on at least one pattern in at least one received fragment on any of the plurality of channels, wherein the one or more received fragments received from each individual channel is at least one pattern in duration, and is spaced from a subsequent received fragment on that channel by an idle time, wherein the at least one received fragment is stored in the preamble detector as correlator content and each of the plurality of correlators is configured to operate on one of the plurality of channels to detect the at least one pattern either while a received fragment is being received, or during the idle time by cyclically shifting correlation coefficients relative to the correlator content.

14. The apparatus of claim 13, wherein the plurality of correlators are operating at a first rate while receiving a received fragment and at a second rate when cyclically shifting the correlation coefficients relative to the correlator content and wherein the second rate is higher than the first rate.

15. The apparatus of claim 13, wherein parameters of the RF circuit are modified during the idle time.

16. An apparatus for receiving a packet on a wireless network, wherein the packet includes a preamble field where a preamble is located, wherein the preamble is made up of a plurality of identical patterns, the apparatus comprising:
a first antenna to receive a first signal containing the packet;
a second antenna to receive a second signal containing the packet;
an antenna switch to select the first signal or the second signal from the first antenna and the second antenna by toggling the antenna switch during an idle time;
an RF circuit to process the first signal and the second signal and create a first set of one or more received fragments when processing the first signal and create a second set of one or more received fragments when processing the second signal; and
a preamble detector to detect a preamble based on at least one pattern in either the first set or the second set, wherein each received fragment from the first set is at least one pattern in duration, and successive received fragments are spaced by the idle time equal to a duration of an integral number of identical patterns and each received fragment from the second set is at least one pattern in duration, and successive received fragments are spaced by the idle time equal to the duration of an integral number of identical patterns.

17. The apparatus of claim 16, wherein the preamble detector comprises a first correlator and a second correlator, each comprising a data shift register for holding correlator content from the at least one received fragment and a coefficient register for holding correlation coefficients, and wherein the first correlator detects the at least one pattern either while the received fragment is being received from the first antenna, or during the idle time by cyclically shifting its correlation coefficients relative to its correlator content, and wherein the second correlator detects the at least one pattern either while the received fragment is being received from the second antenna, or during the idle time by cyclically shifting its correlation coefficients relative to its correlator content.

18. The apparatus of claim 16, wherein, in at least one of the first set or the second set, a duration of an integral number of idle times added to a duration of a same integral number of received fragments, is equal to a duration of the preamble field.

19. The apparatus of claim 16, wherein, after the preamble is detected, the apparatus selects one of the antennas to receive the packet, wherein selection of an antenna is based on a received signal strength index (RSSI) of at least one received fragment.

20. The apparatus of claim 16, wherein parameters of the RF circuit are modified between successive received fragments.

\* \* \* \* \*